(12) United States Patent
Yang et al.

(10) Patent No.: US 11,423,996 B1
(45) Date of Patent: Aug. 23, 2022

(54) MEMORY APPARATUS AND METHOD OF OPERATION USING TRIPLE STRING CONCURRENT PROGRAMMING DURING ERASE

(71) Applicant: SanDisk Technologies LLC, Addison, TX (US)

(72) Inventors: Xiang Yang, Santa Clara, CA (US); Yi Song, San Jose, CA (US); Fanqi Wu, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/323,293

(22) Filed: May 18, 2021

(51) Int. Cl.
| G11C 16/34 | (2006.01) |
| G11C 16/04 | (2006.01) |
| G11C 16/08 | (2006.01) |
| G11C 16/16 | (2006.01) |
| G11C 16/24 | (2006.01) |

(52) U.S. Cl.
CPC ...... *G11C 16/3445* (2013.01); *G11C 16/0441* (2013.01); *G11C 16/08* (2013.01); *G11C 16/16* (2013.01); *G11C 16/24* (2013.01); *G11C 16/3404* (2013.01)

(58) Field of Classification Search
CPC . G11C 16/3445; G11C 16/0441; G11C 16/08; G11C 16/16; G11C 16/24; G11C 16/3404
See application file for complete search history.

(56) References Cited

U.S. PATENT DOCUMENTS

| 7,907,449 | B2 | 3/2011 | Lee et al. | |
| 8,787,094 | B2* | 7/2014 | Costa | G11C 29/52 |
| | | | | 365/185.17 |
| 9,224,494 | B2* | 12/2015 | Chin | G11C 16/3454 |
| 9,240,241 | B2 | 1/2016 | Costa et al. | |
| 9,812,462 | B1* | 11/2017 | Pang | H01L 29/40117 |
| 9,922,992 | B1* | 3/2018 | Yu | H01L 21/2256 |
| 9,934,860 | B1* | 4/2018 | Ishida | G11C 16/0483 |
| 10,381,083 | B1* | 8/2019 | Yang | G11C 16/16 |
| 10,665,301 | B1* | 5/2020 | Lu | G11C 16/0483 |
| 10,741,253 | B1* | 8/2020 | Lu | G11C 16/16 |
| 10,861,559 | B1* | 12/2020 | Desai | G11C 16/08 |
| 10,923,197 | B2 | 2/2021 | Lu et al. | |
| 10,930,355 | B2 | 2/2021 | Yang et al. | |
| 2019/0156896 | A1* | 5/2019 | Park | G11C 16/3445 |
| 2020/0005871 | A1 | 1/2020 | Yang et al. | |

(Continued)

*Primary Examiner* — Tri M Hoang
(74) *Attorney, Agent, or Firm* — Dickinson Wright PLLC; Steven C. Hurles

(57) ABSTRACT

A memory apparatus and method of operation is provided. The apparatus includes a block of memory cells. Each of the memory cells is connected to one of a plurality of word lines and arranged in strings. Each of the memory cells is also configured to retain a threshold voltage corresponding to one of a plurality of data states and be erased in an erase operation. A control circuit is coupled to the word lines and the strings and is configured to identify ones of the strings having a faster relative erase speed compared to others of the strings. During the erase operation, the control circuit raises the threshold voltage of the memory cells associated with the ones of the strings having the faster relative erase speed while not raising the threshold voltage of the memory cells associated with the others of the strings.

20 Claims, 26 Drawing Sheets

(56) References Cited

U.S. PATENT DOCUMENTS

2020/0075102 A1\* 3/2020 Liu .................... G11C 16/0483
2020/0388338 A1\* 12/2020 Yang ...................... G11C 16/10
2021/0280260 A1\* 9/2021 Shiino .................. G11C 16/344

\* cited by examiner

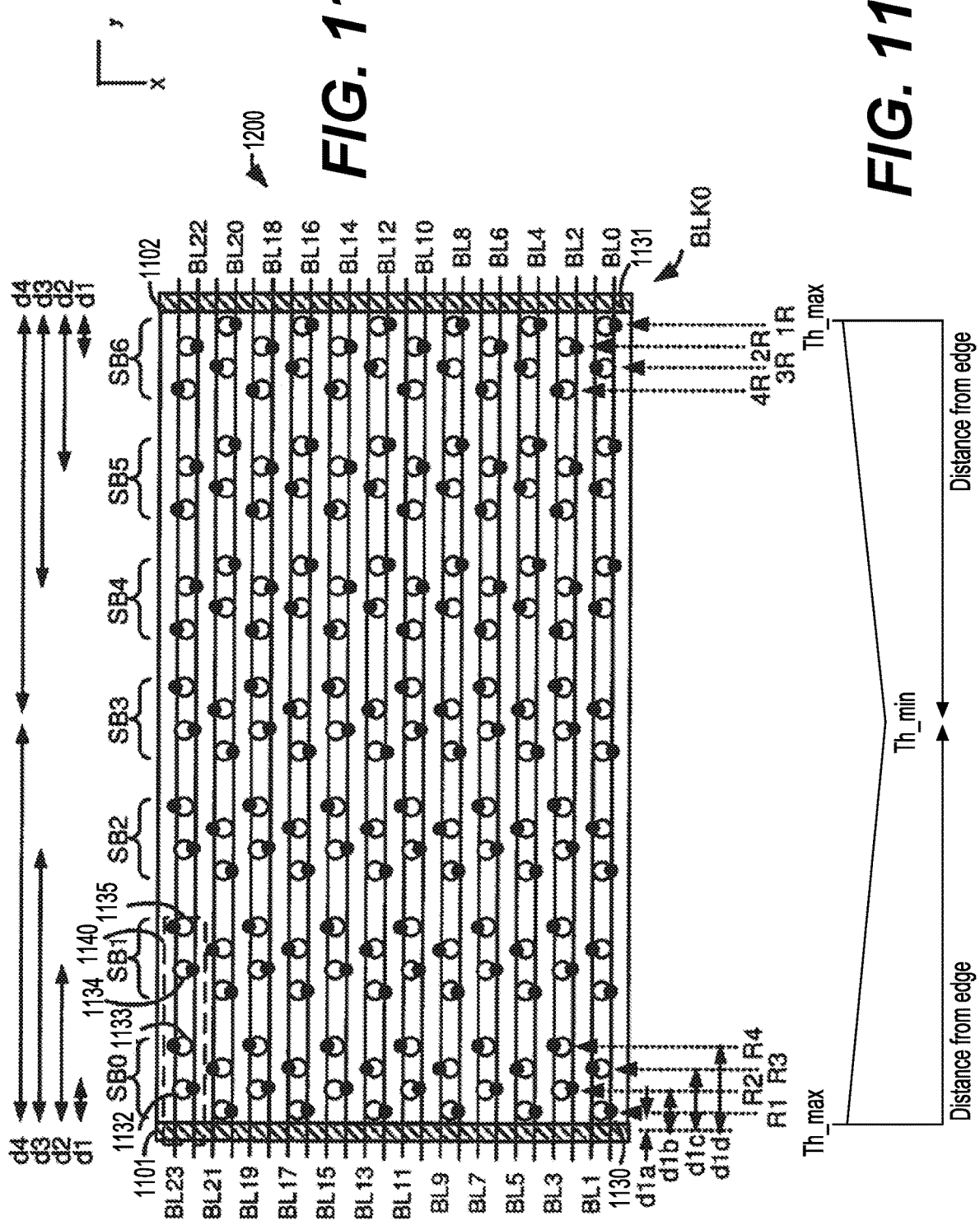

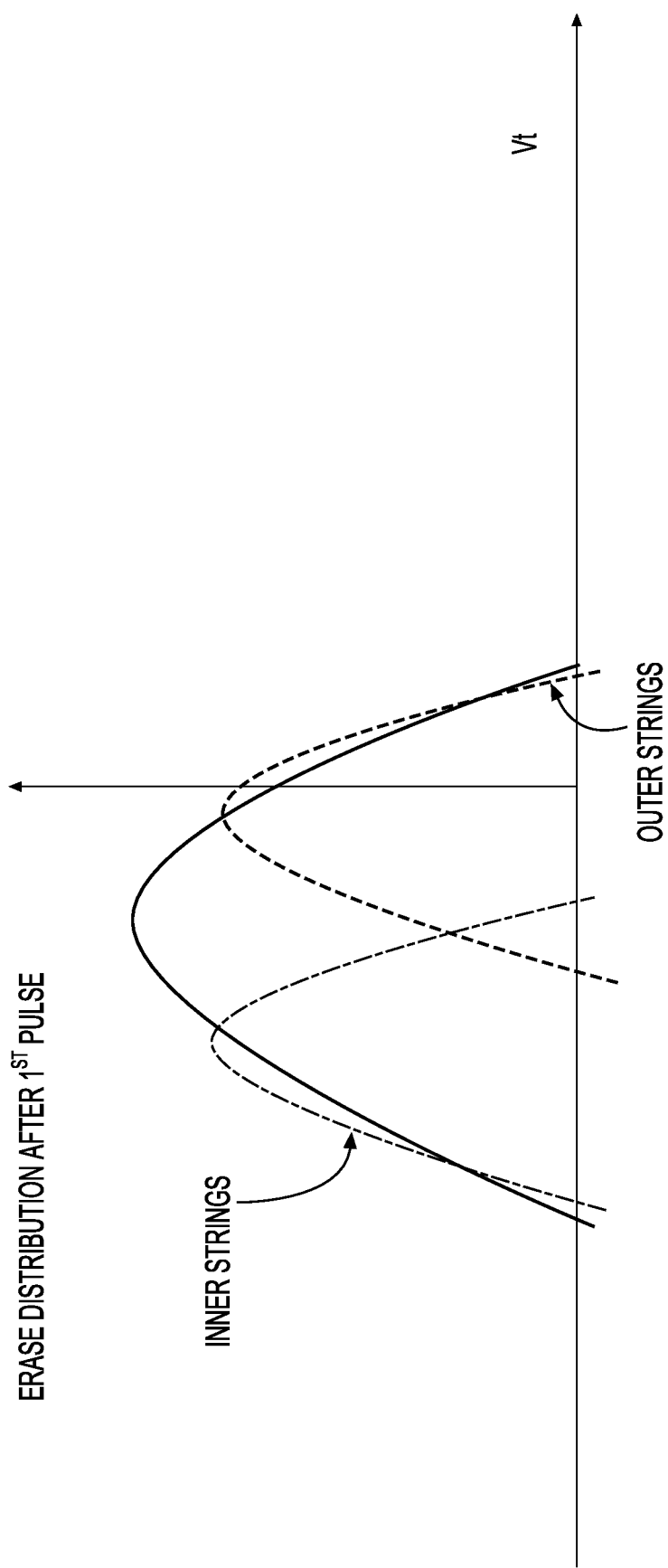

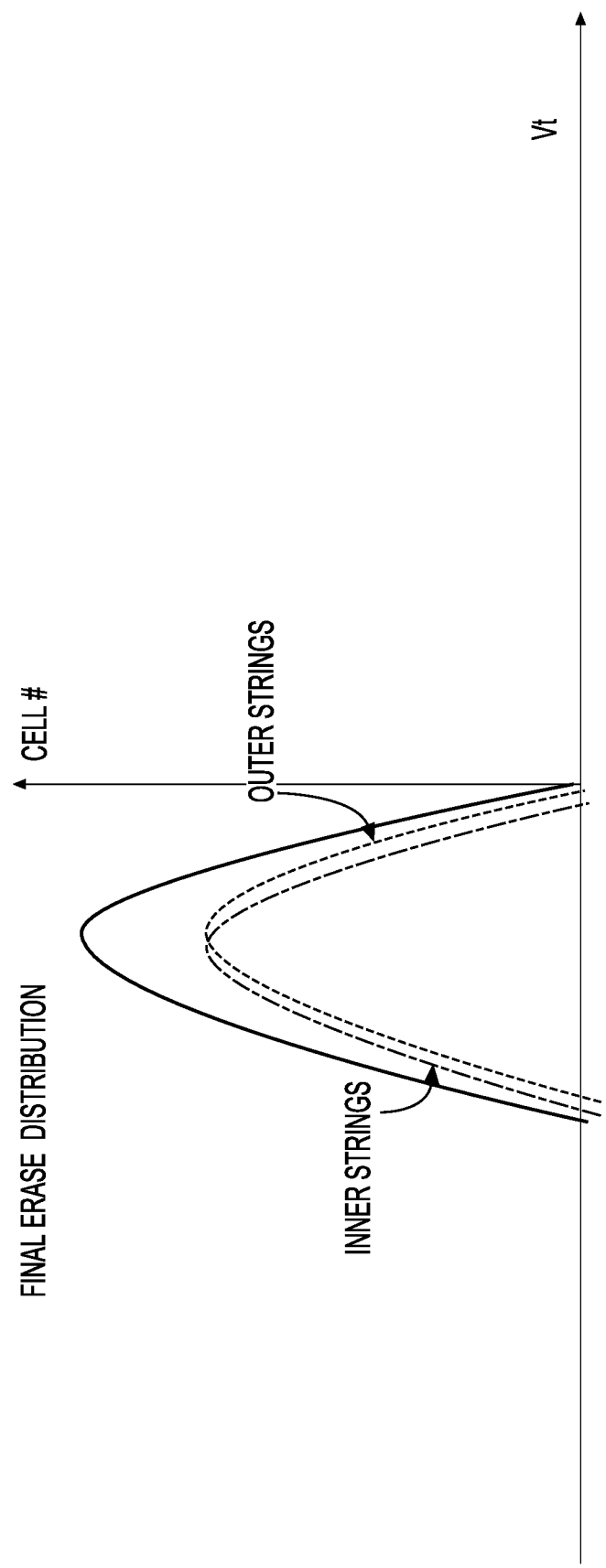

MEMORY APPARATUS AND METHOD OF OPERATION USING TRIPLE STRING CONCURRENT PROGRAMMING DURING ERASE

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

SUMMARY

This section provides a general summary of the present disclosure and is not a comprehensive disclosure of its full scope or all of its features and advantages.

It is an aspect of the present disclosure to provide a memory apparatus including a block of memory cells. Each of the memory cells is connected to one of a plurality of word lines and arranged in strings. Each of the memory cells is also configured to retain a threshold voltage corresponding to one of a plurality of data states and be erased in an erase operation. A control circuit is coupled to the word lines and the strings and is configured to identify ones of the strings having a faster relative erase speed compared to others of the strings. During the erase operation, the control circuit raises the threshold voltage of the memory cells associated with the ones of the strings having the faster relative erase speed while not raising the threshold voltage of the memory cells associated with the others of the strings.

According to another aspect of the disclosure, a controller in communication with a memory apparatus including a block of memory cells is also provided. Each of the memory cells is connected to one of a plurality of word lines and arranged in strings. Each of the memory cells is also configured to retain a threshold voltage corresponding to one of a plurality of data states and be erased in an erase operation. The controller is configured to instruct the memory apparatus to identify ones of the strings having a faster relative erase speed compared to others of the strings. During the erase operation, the controller is configured to instruct the memory apparatus to raise the threshold voltage of the memory cells associated with the ones of the strings having the faster relative erase speed while not raising the threshold voltage of the memory cells associated with the others of the strings.

According to an additional aspect of the disclosure, a method of operating a memory apparatus is provided. The memory apparatus includes a block of memory cells. Each of the memory cells is connected to one of a plurality of word lines and arranged in strings. Each of the memory cells is also configured to retain a threshold voltage corresponding to one of a plurality of data states and be erased in an erase operation. The method includes the step of identifying ones of the strings having a faster relative erase speed compared to others of the strings. The method also includes the step of during the erase operation, raising the threshold voltage of the memory cells associated with the ones of the strings having the faster relative erase speed while not raising the threshold voltage of the memory cells associated with the others of the strings.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 11A depicts a top view of the example block of FIG. 10B, where each sub-block comprise four rows of NAND strings according to aspects of the disclosure;

FIG. 11B depicts a plot showing a varying thickness of a blocking oxide layer in the block of FIG. 11A as a function of a distance from a nearest edge of the block according to aspects of the disclosure;

Figure 18A:
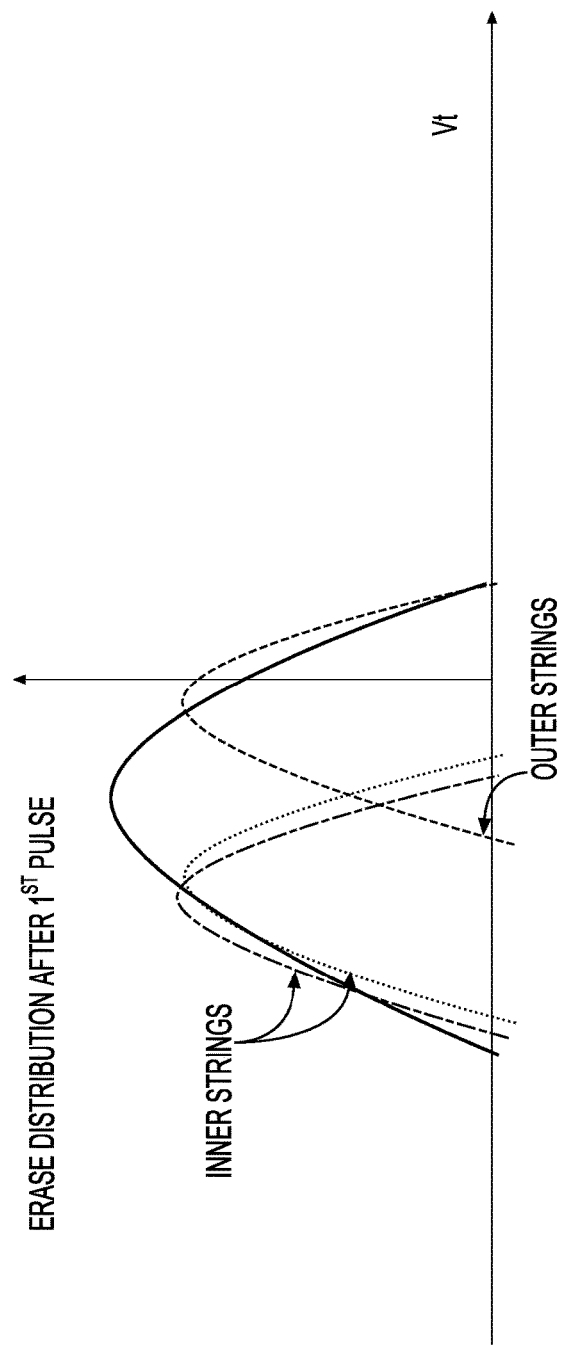
Figure 18B:
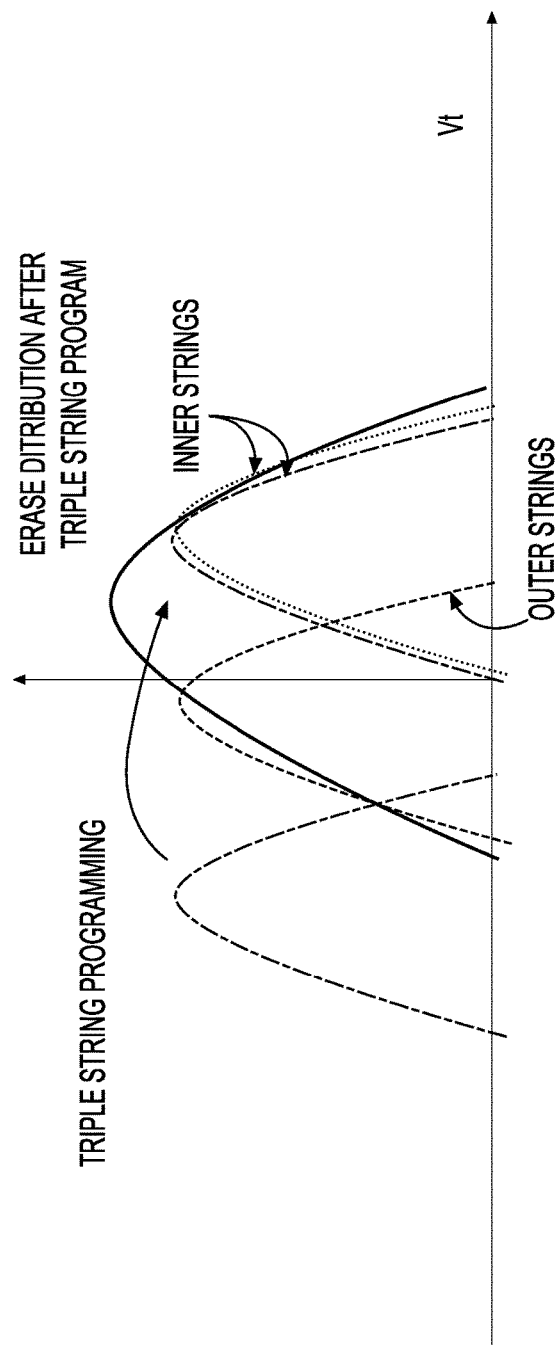
Figure 19:
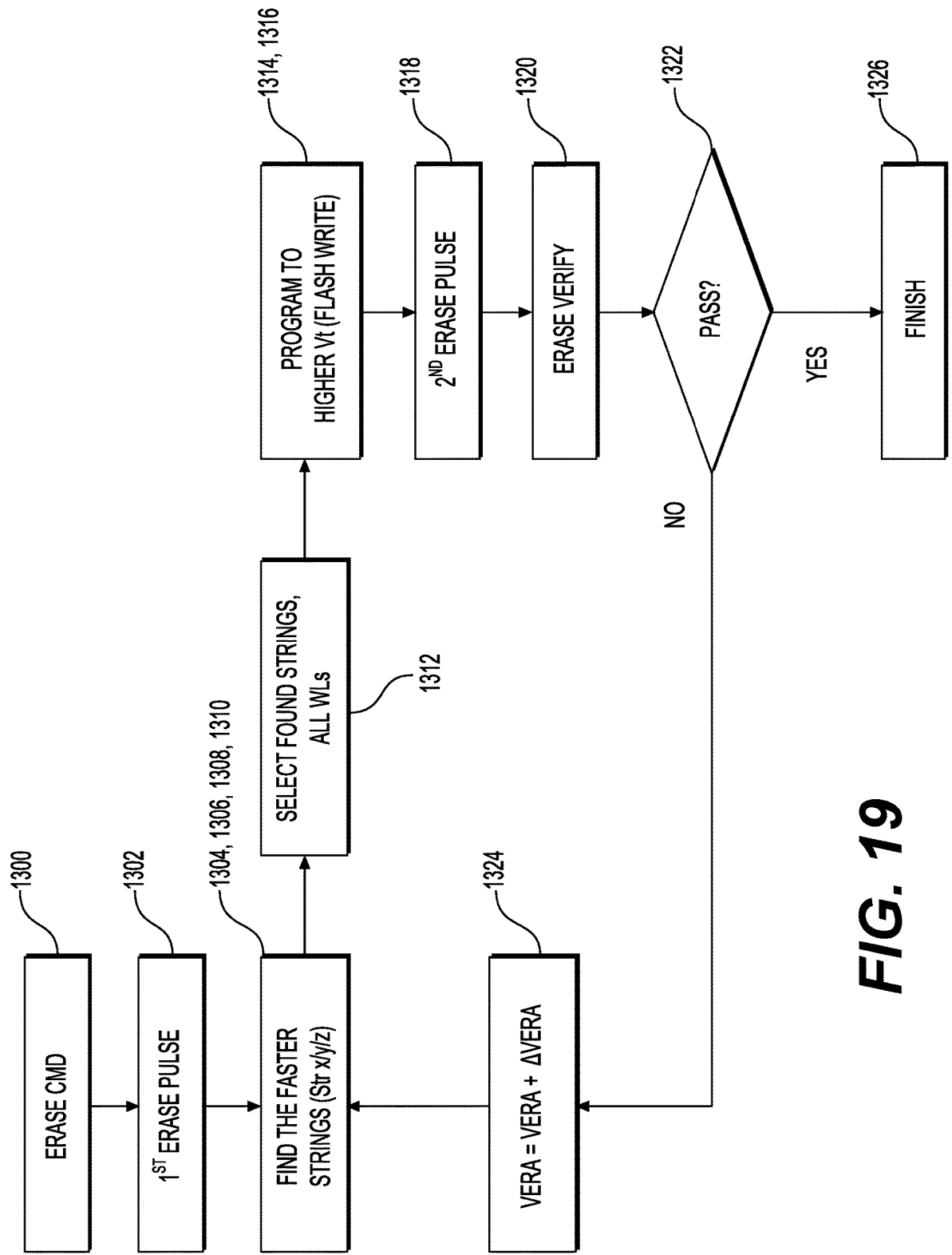
Figure 20:
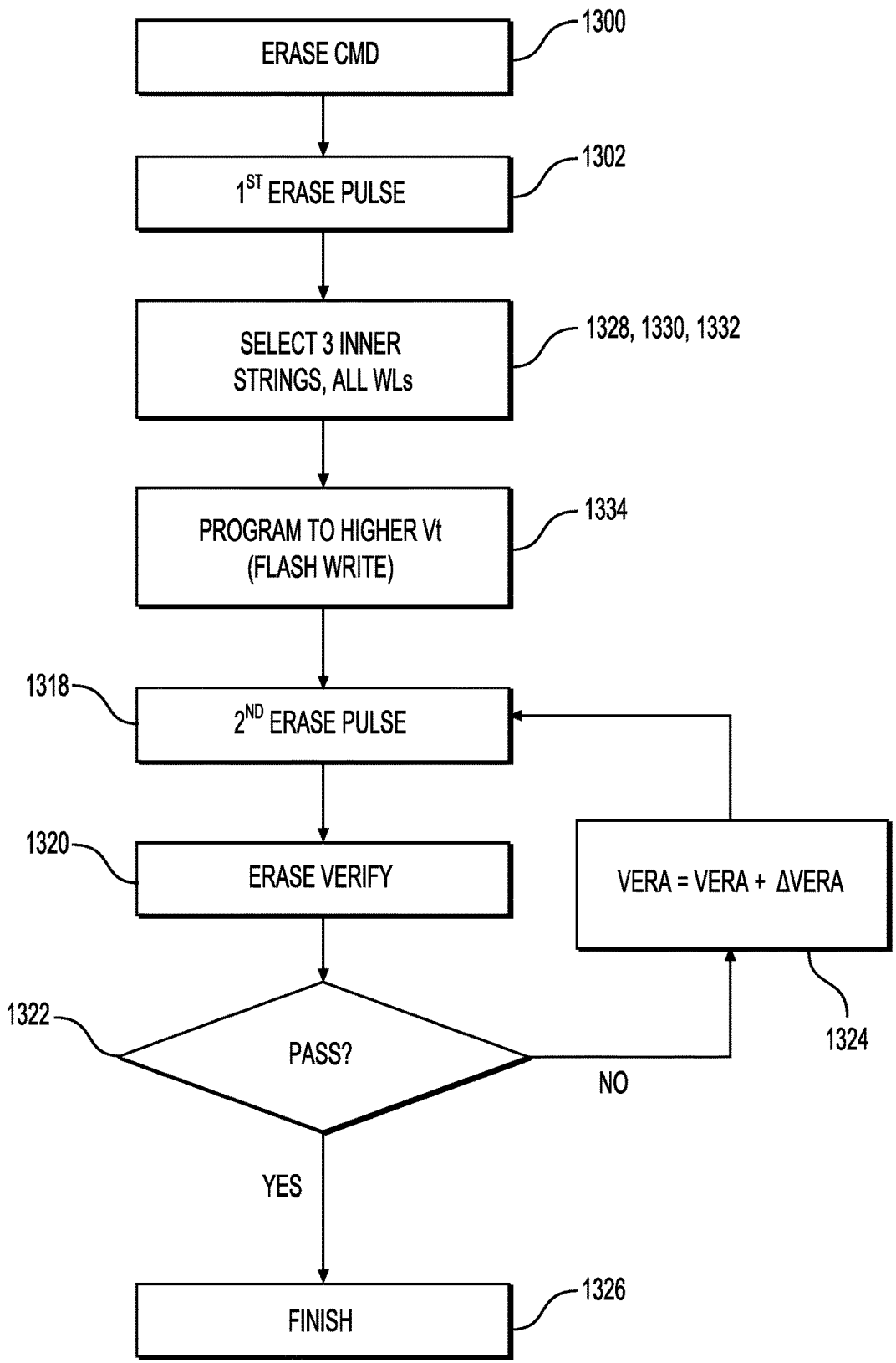
Figure 21B:
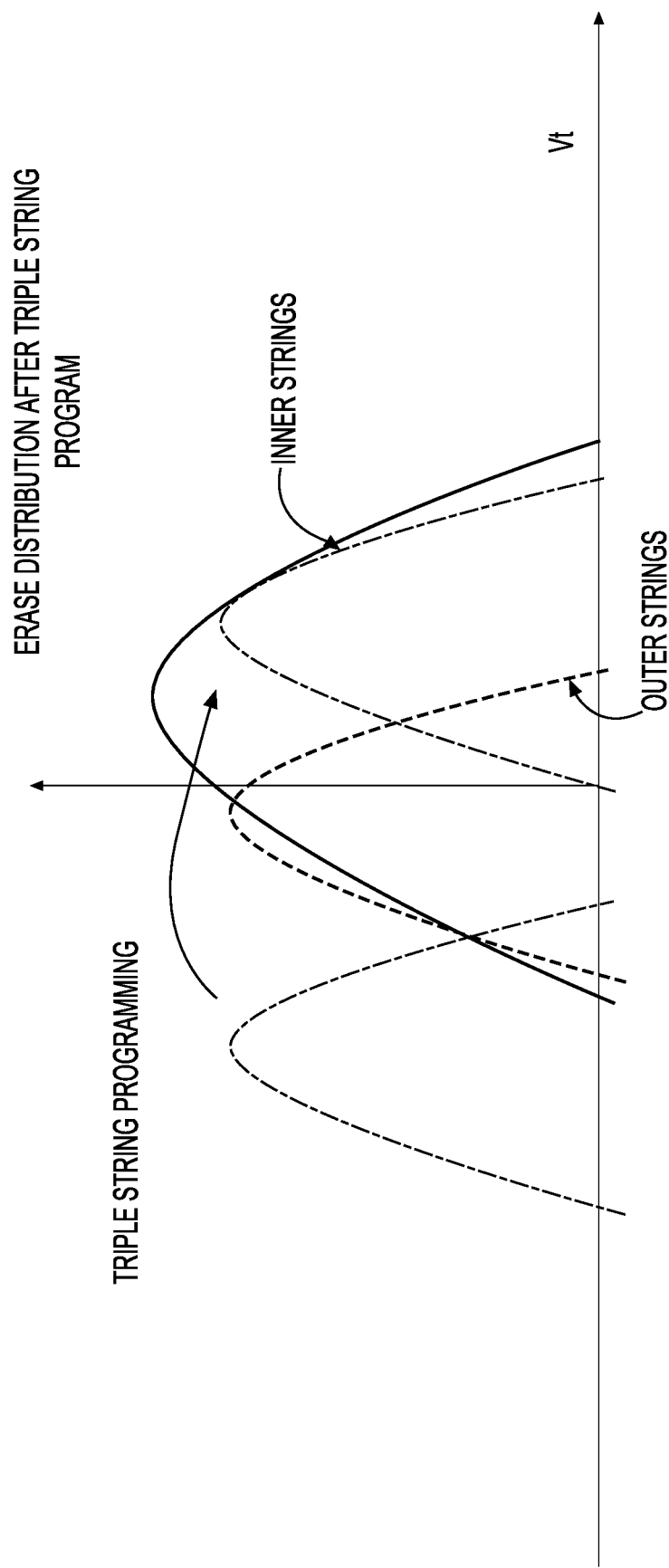

FIGS. 18A and 18B respectively show example inner string and outer string threshold voltage distributions along with total threshold voltage distributions following a first erase pulse and after triple string programming according to aspects of the disclosure;

FIGS. 19 and 20 illustrate steps of a method of operating the memory apparatus according to aspects of the disclosure;

FIG. 21A shows a threshold voltage distribution for the plurality of inner strings and for the plurality of outer strings that together form a total erase threshold voltage distribution after the first erase pulse according to aspects of the disclosure;

FIG. 21B shows another threshold voltage distribution for the plurality of inner strings and for the plurality of outer strings that together form a total erase threshold voltage distribution after the triple string programming according to aspects of the disclosure; and FIG. 21C shows another threshold voltage distribution for the plurality of inner strings and for the plurality of outer strings that together form a final erase threshold voltage distribution at the end of the erase operation according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments involving optimizing an erase operation in a memory device or apparatus to compensate for erase speed variations due to factors such as blocking oxide layer thinning. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The blocking oxide layer separates the charge trapping layer from the word line so that charges in the charge trapping layer are blocked from reaching the word line.

The layers may be arranged concentrically. Each NAND string may have the shape of a pillar which intersects with the word lines to form the memory cells.

Each memory cell may be associated with a data state according to write data in a program command based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states (see FIG. 7). In a three-bit per cell memory device, there are eight data states including the erased state and seven higher data states referred to as the A-G data states. In a four-bit per cell memory device, there are sixteen data states including the erased state (S0) and fifteen higher data states, S0-S15.

A program operation may use a set of increasing program voltages or pulse which are applied to the word line in respective program loops or program-verify iterations in one or more program passes.

Verify tests may be performed after each program voltage to determine whether the memory cells have completed programming A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the threshold voltage (Vth, Vt, or VTH) of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the threshold voltage Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

An erase operation involves transitioning the memory cells from the programmed state to an erased state. During the erase operation, it is desired to lower the threshold voltage Vth of each memory cell below an erase-verify level which represents an erased data state. An erase operation can include a number of erase loops, where each loop comprises an erase portion follow by a verify portion. In the erase portion, voltages are applied to the block to provide a positive channel-to-gate voltage for the memory cells of the block to drive electrons out of the charge-storing material of the cells, thereby reducing the Vth of the memory cells. In the verify portion, a verify voltage is applied to the control gates of the memory cells via the word lines of the block, and sensing circuitry is used to sense currents in the NAND strings to determine if the memory cells have been sufficiently erased.

A positive channel-to-gate voltage is obtained by charging up (increasing a voltage of) the channels of the NAND strings by introducing holes (positive charges) into the channel One approach is to generate holes by gate-induced drain leakage (GIDL) at the SGD transistors of the NAND strings. GIDL can be generated in proportion to a drain-to-gate voltage of the SGD transistors, where the drain voltage is equal to the bit line voltage.

However, the erase speed can vary for memory cells of different NAND strings based on their distance from the edge of a block, where an etchant is introduced to remove the sacrificial material of the word lines before depositing the metal of the word lines during the fabrication of the block. See FIGS. 11A-11C, for instance. In particular, in addition to removing the sacrificial material, the etchant removes some of the blocking oxide layer 563, 563a, 563b and 563c of the memory cells. Moreover, the blocking oxide layers which are closest to the edge of the block receive the most etching and become the thinnest. Thus, the thickness Th (FIG. 11B) of the blocking oxide layers, which may comprise silicon dioxide (SiO2), varies for memory holes based on their distance from the closest edge of the block from which an etchant is introduced. See example edges 1130 and 1131 in FIG. 11A. A thinner blocking oxide layer results in a faster erase speed because the gate-to-channel distance decreases. With a given gate-to-channel voltage in the erase operation, the electric field strength is larger when the gate-to-channel distance is smaller.

Techniques provided herein address the above and other issues. In particular, an erase operation accounts for different erase speeds of different strings of a block based on the positions of the strings in the block and based on the corresponding blocking oxide layer thickness associated with the position. These and other features are discussed further below.

Figure 1:
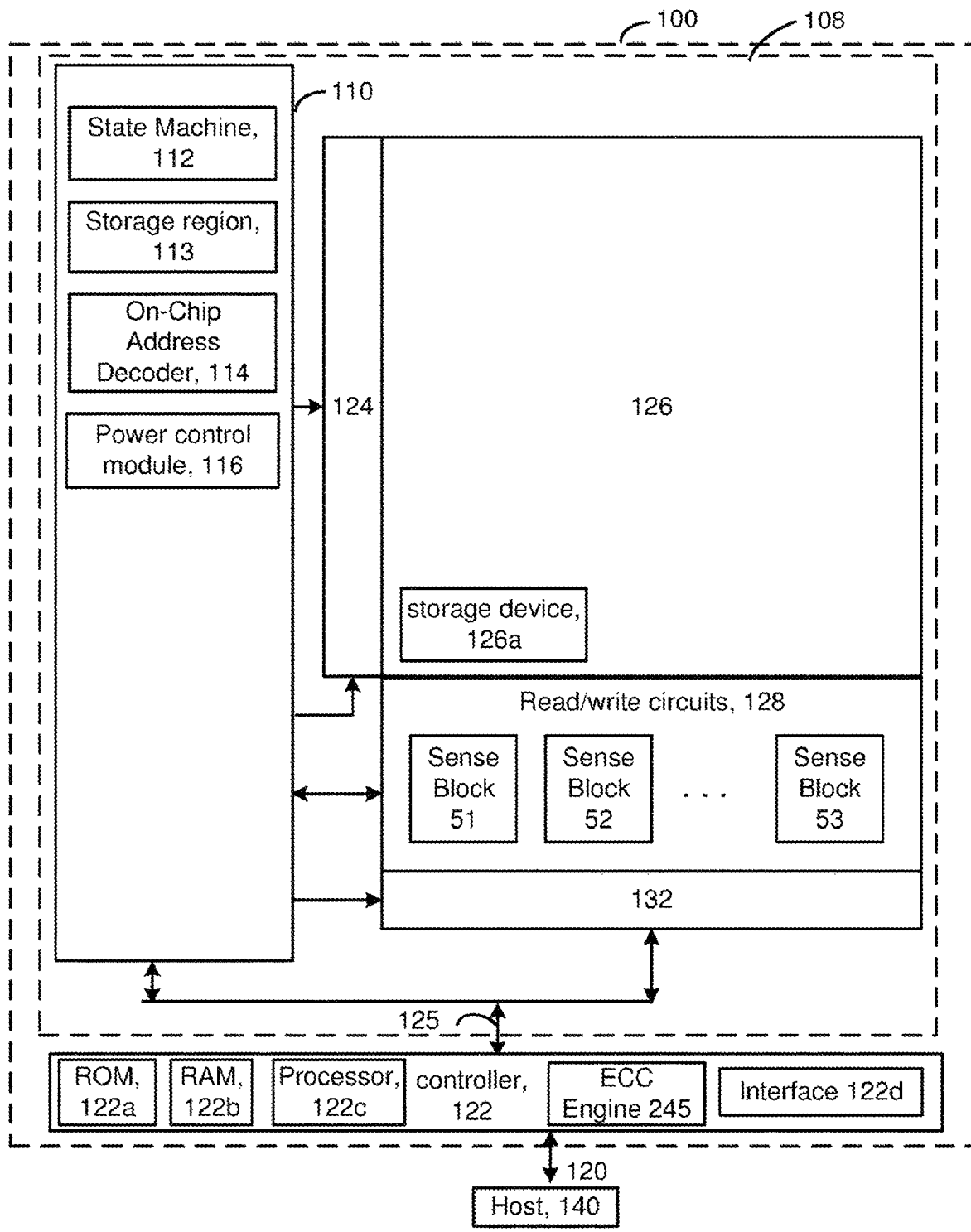
FIG. 1 is a block diagram of an example memory device according to aspects of the disclosure.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 125.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates.

The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. The control circuit is configured to program memory cells by applying one or more program pulses to a selected word line, and to apply program-inhibit and program-enable bit line voltages during the program pulses.

For example, a control circuit such as a programming circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
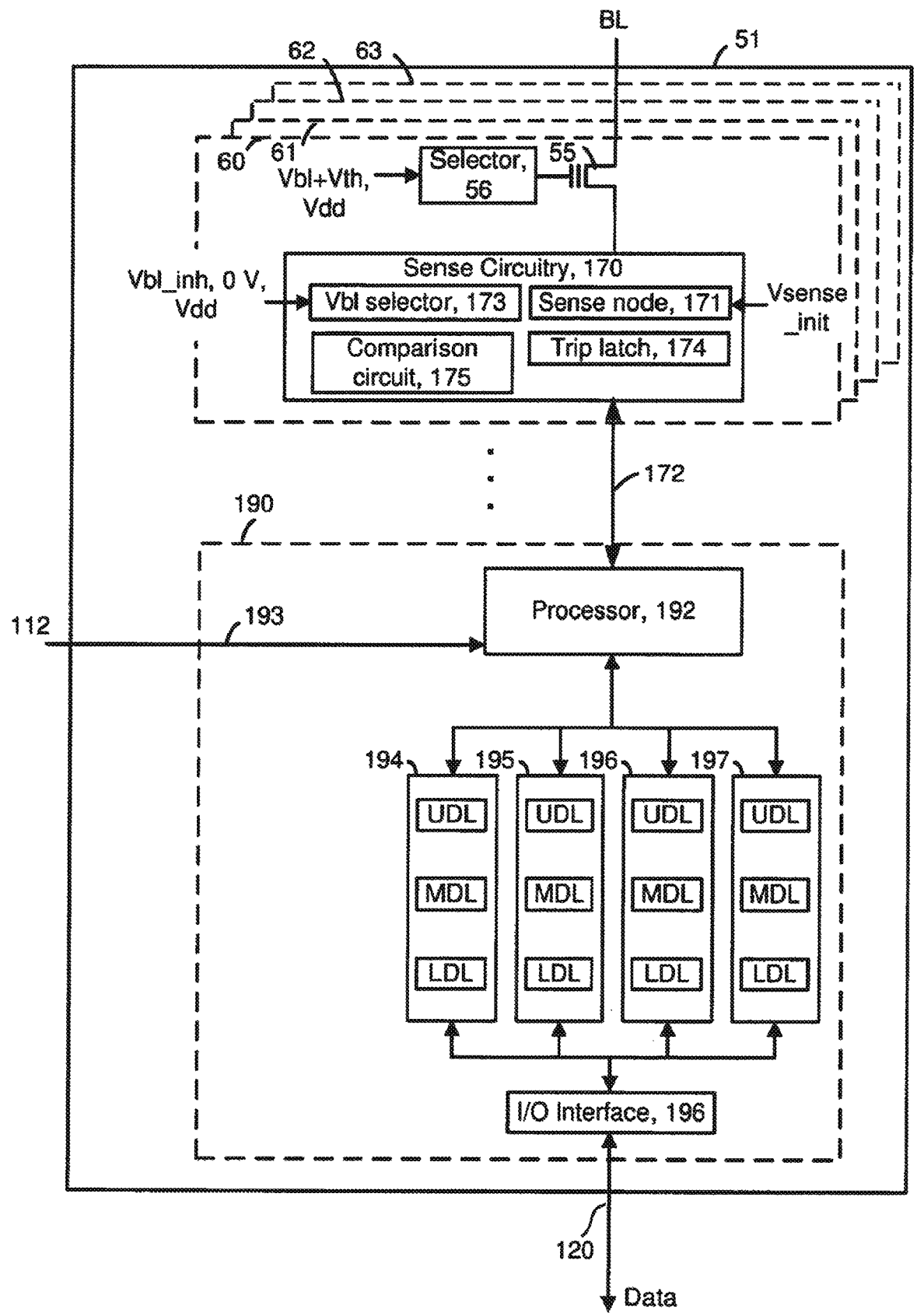
FIG. 2 is a block diagram depicting one embodiment of the sense block 51 of FIG. 1 according to aspects of the disclosure.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program-inhibit voltage Vbl_inh (e.g., 2 V) to a bit line connected to a memory cell which is inhibited from programmed, or a program-enable voltage, e.g., 0 V, to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector

56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. For example, in a program operation, if the sense node voltage decays below the trip voltage Vtrip, the memory cell is in a conductive state and its Vth is at or below the program-verify voltage and has not completed being programmed (the program-verify test is not passed). If the sense node voltage does not decay below Vtrip, the memory cell is in a non-conductive state and its Vth is above the program-verify voltage and has completed being programmed (the program-verify test is passed). The sense circuit 60 includes a trip latch 174 that is set by the comparison circuit 175 based on whether the memory cell is in a conductive or non-conductive state. The data in the trip latch can be a bit which is read out by the processor 192.

During an erase-verify test of an erase operation, an amount of decay of the sense node is used to determine whether a NAND strings is in a conductive or non-conductive state. If the sense node voltage decays below the trip voltage Vtrip, the NAND string is in a conductive state and its Vth is at or below the erase-verify voltage and has completed being erased, e.g., the erase-verify test is passed. If all, or nearly all of the NAND strings in a sub-block have completed being erased, the sub-block is also considered to have completed being erased and is inhibited from being further erased in a subsequent erase loop of the erase operation.

If the sense node voltage does not decay below Vtrip, the NAND string is in a non-conductive state and its Vth is above the erase-verify voltage and has not completed being erased, e.g., the erase-verify test is not passed. If a significant number of the NAND strings in a sub-block have not completed being erased, such as more than 1-5% of the NAND strings, the sub-block is also considered to not have completed being erased and is further erased in a subsequent erase loop of the erase operation.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
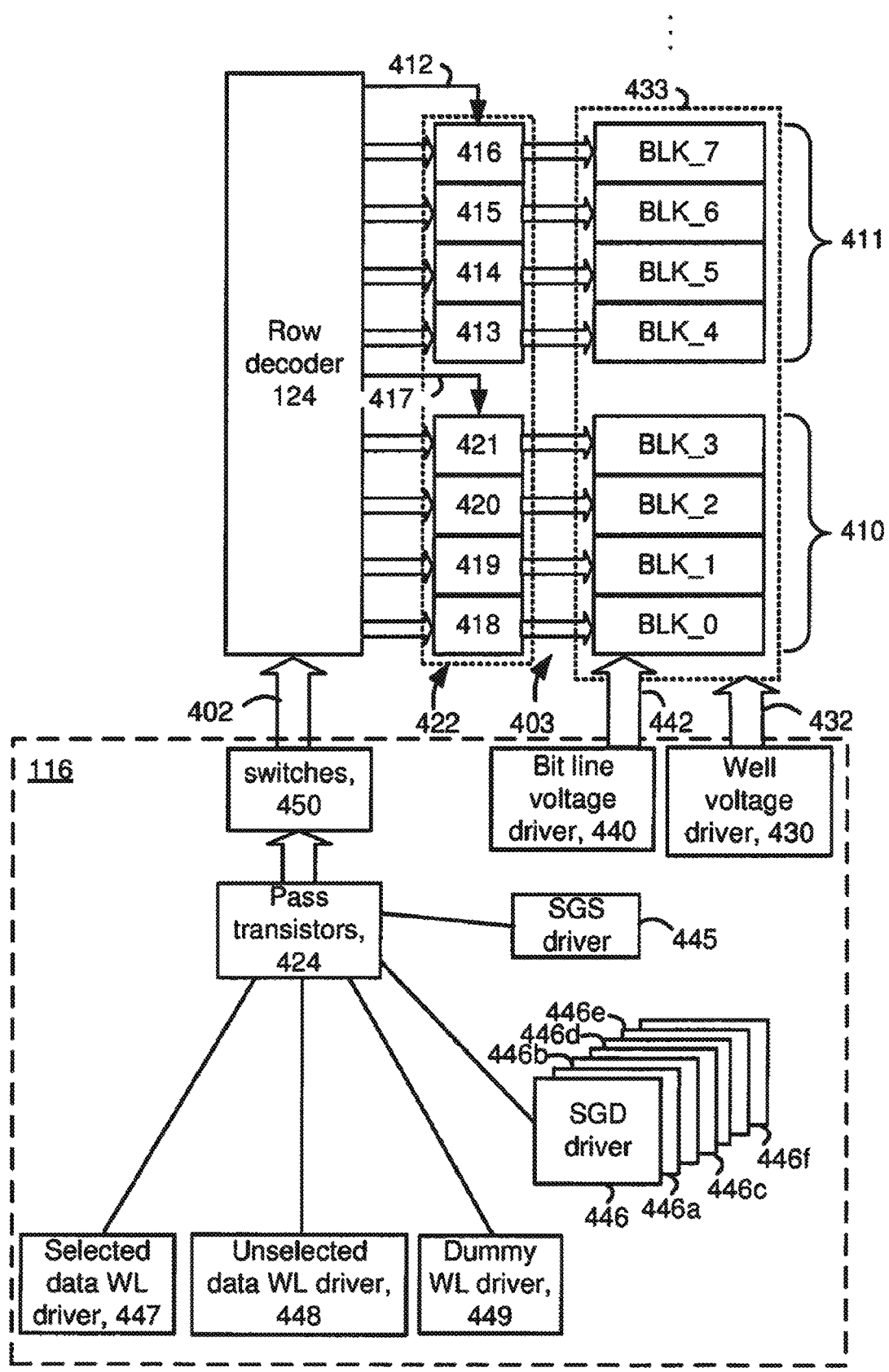
FIG. 3 depicts an example implementation of the power control module of FIG. 1 for providing voltages to blocks of memory cells according to aspects of the disclosure.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on (conductive), a voltage from the row decoder is provided to the respective control gate lines or word lines. If the pass transistors are off (non-conductive), the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation is typically performed initially on an entire block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 5A:
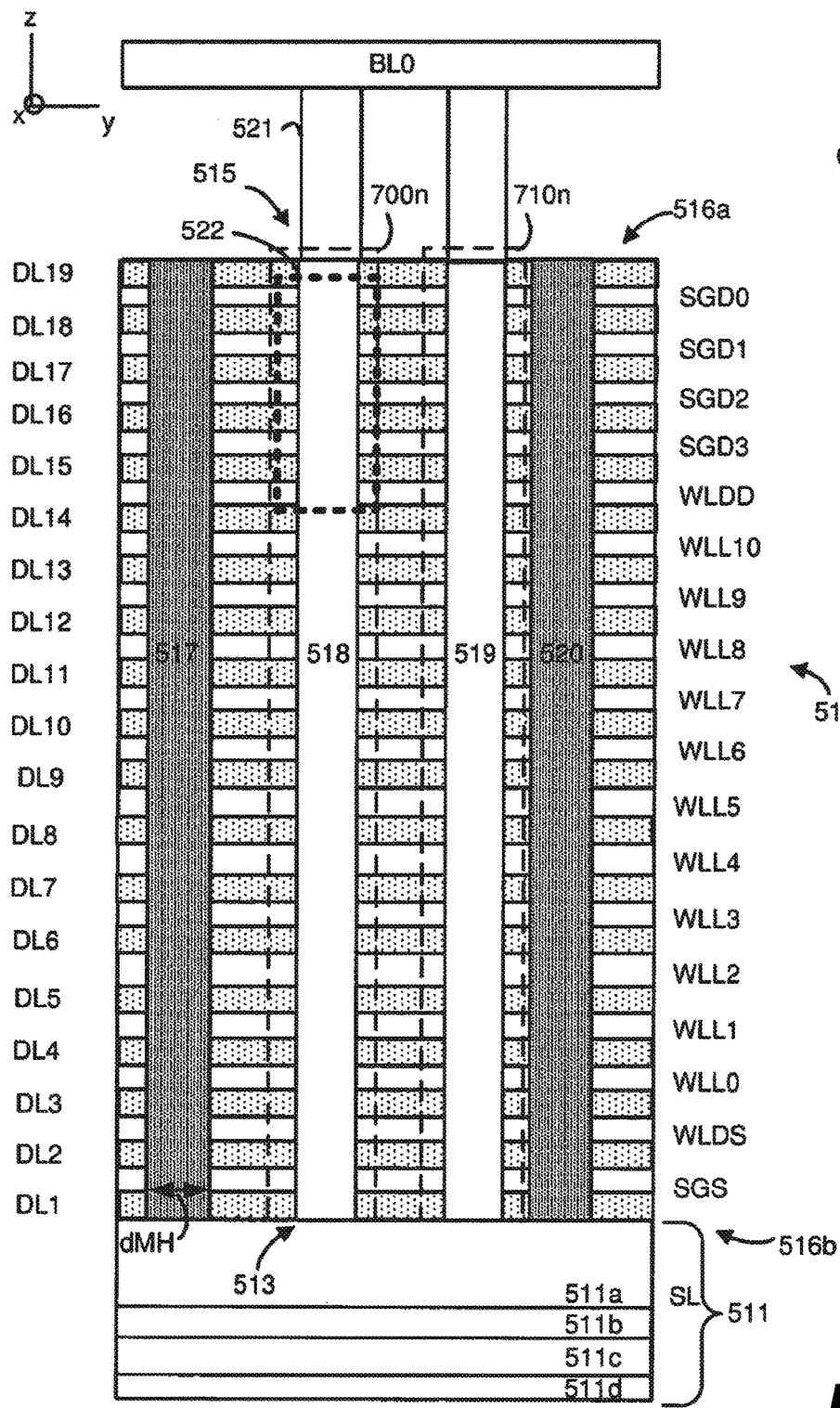
FIG. 5A depicts an example cross-sectional view of a portion of the block of FIG. 4 according to aspects of the disclosure.

The voltage drivers can include a selected data word line (WL) driver 447, which provides a voltage on a data word line selected during a program or read operation, a driver 448 for unselected data word lines, and a driver for dummy word lines 449 (e.g., WLDS0, WLDD1, WLDS1 and WLDS0, respectively, in FIG. 5A).

The voltage drivers can also include an SGS driver 445 for a block, and separate SGD drivers 446-446f for sub-blocks SB0-SB6, respectively. In another example, there is one SGD driver shared by each sub-block, and another SGD driver specific to each sub-block.

In some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

Figure 4:
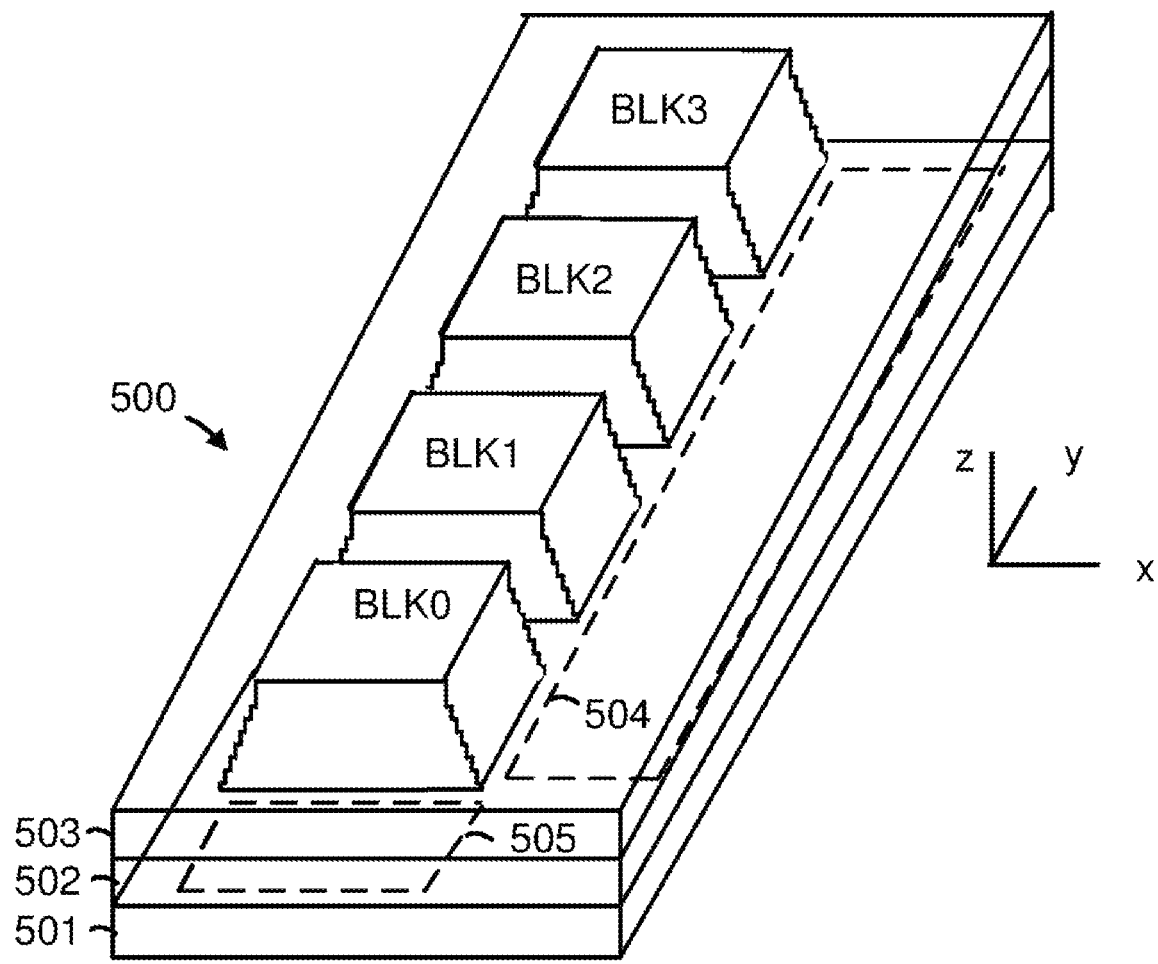
FIG. 4 is a perspective view of a memory device comprising a set of blocks in an example 3D configuration of the memory structure of FIG. 1 according to aspects of the disclosure.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 6, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 516 of alternating conductive layers (e.g., word lines or control gate lines) and dielectric layers. In this example, the conductive layers comprise first through four SGD layers, SGD0-SGD3, respectively. The conductive layers also include one SGS layer, one source side dummy word line layer WLDS, one drain side dummy word line layer WLDD, and eleven data word line layers (or data word lines) WLL0-WLL10. WLL0 is a source side data word line and WLL10 is a drain side data word line. The dielectric layers are labelled as DL1-DL19. Further, regions of the stack which comprise NAND strings 700n and 710n are depicted. Each NAND string encompasses a memory hole 518 or 519 which is filled with materials which form memory cells adjacent to the word lines. Region 522 of the stack is shown in greater detail in FIG. 6.

The stack includes a substrate 511. In one approach, a portion of the source line SL comprises a well region 511a as an n-type source diffusion layer or well in the substrate. The well region is in contact with a source end of each string of memory cells in a block. An erase pulse may be applied to this layer in an erase operation The n-type well region 511a is formed in a p-type well region 511b, which in turn is formed in an n-type well region 511c, which in turn is formed in a p-type semiconductor substrate 511d, in one possible implementation. The n-type source diffusion layer may be shared by all of the blocks in a plane, in one approach.

NAND string 700n has a source-end 513 at a bottom 516b of the stack 516 and a drain-end 515 at a top 516a of the stack. Metal-filled slits 517 and 520 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 521 connects the drain-end 515 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

A memory hole diameter, dMH, is also depicted. See FIG. 5C for further details.

Figure 5B:
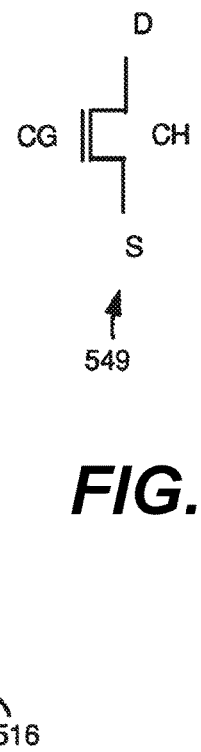
FIG. 5B depicts an example transistor in the block of FIG. 4 according to aspects of the disclosure.
Figure 6:
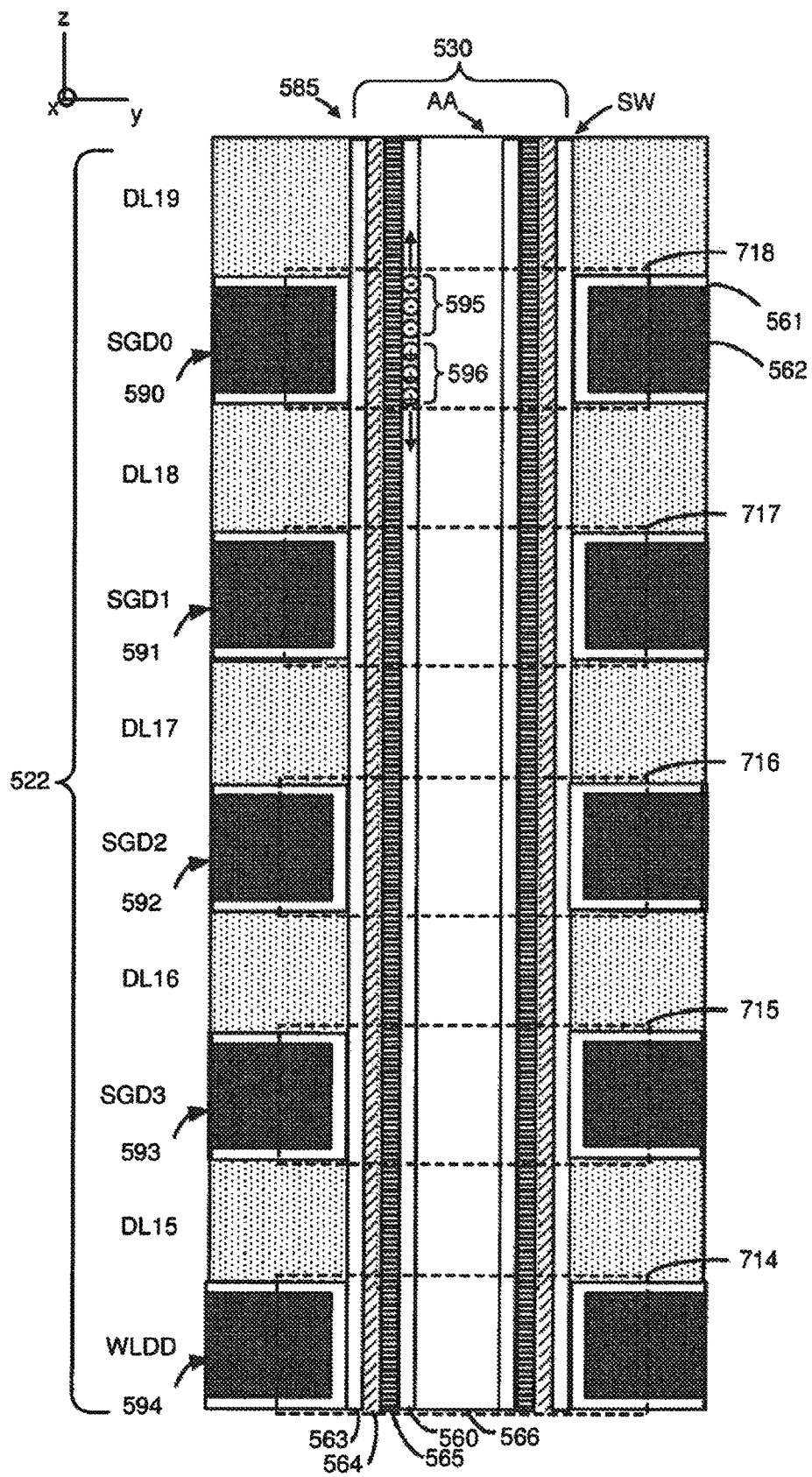
FIG. 6 depicts a close-up view of a region of the stack of FIG. 5A according to aspects of the disclosure.

FIG. 5B depicts an example transistor 549 in BLK0 in FIG. 4. The transistor comprises a control gate CG, a drain D, a source S and a channel CH and may represent a memory cell or a select gate transistor, for example.

Figure 5C:
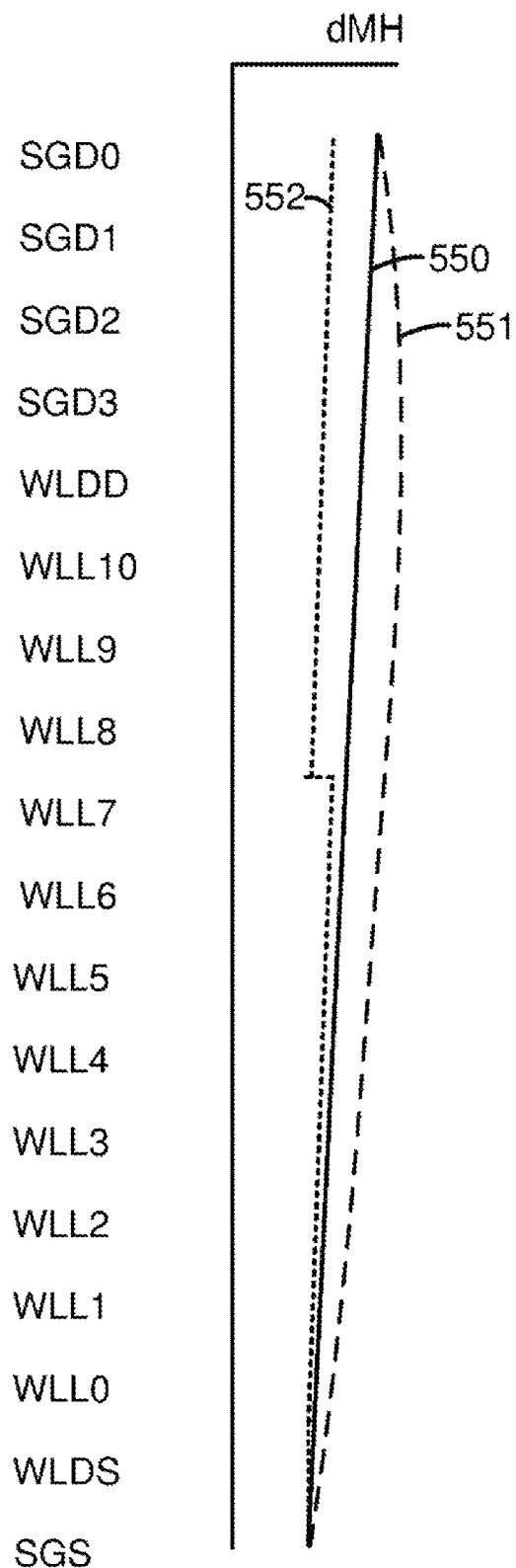
FIG. 5C depicts a plot of memory hole diameter in the stack of FIG. 5A according to aspects of the disclosure.

FIG. 5C depicts a plot of memory hole diameter in the stack of FIG. 5A. The vertical axis depicts a diameter dMH of the memory holes and the pillars formed by materials in the memory holes. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (plot 550). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (plot 551).

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher. This variation is in addition to the variation caused by different thicknesses of the blocking oxide layer.

In another possible implementation, represented by plot 552, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 6 depicts a close-up view of the region 522 of the stack of FIG. 5A. Select gate transistors and memory cells are formed at the different levels of the stack at the intersection of a word line layer and a memory hole. In this example, SGD transistors 715-718 are formed above a dummy memory cell 714 at the drain end of the NAND string.

A number of layers can be deposited along the sidewall (SW) of the memory hole 530 and/or within each word line layer, e.g., using atomic layer deposition. For example, each pillar 585 or column which is formed by the materials within a memory hole can include a blocking oxide layer 563 (e.g., comprising SiO2), a charge-trapping layer 564 or film (e.g., comprising silicon nitride, Si3N4, or other nitride), a tunneling layer 565 (e.g., comprising a gate oxide), a channel 560 (e.g., comprising polysilicon), and a dielectric core 566 (e.g., comprising SiO2). A word line layer can include a metal barrier 561 and a conductive metal 562 such as Tungsten as a control gate. For example, control gates 590-594 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. The channels are continuous in that they are uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge.

During an erase operation, the electrons return to the channel. Also during an erase operation, the channel of a NAND string may be charged, e.g., its voltage increased, by generating holes in the channel. In one approach, the topmost or first SGD transistor is used to generate electron-hole pairs using GIDL. The electrons 595 move upward in the channel in the direction of the positive erase voltage at the bit line and the drain end of the NAND string, while the holes 596 move downward in the channel toward the source end of the NAND string. The holes become distributed in the channel adjacent to the memory cells so that a high positive channel-to-gate voltage can be obtained to erase the memory cells.

Figure 7:
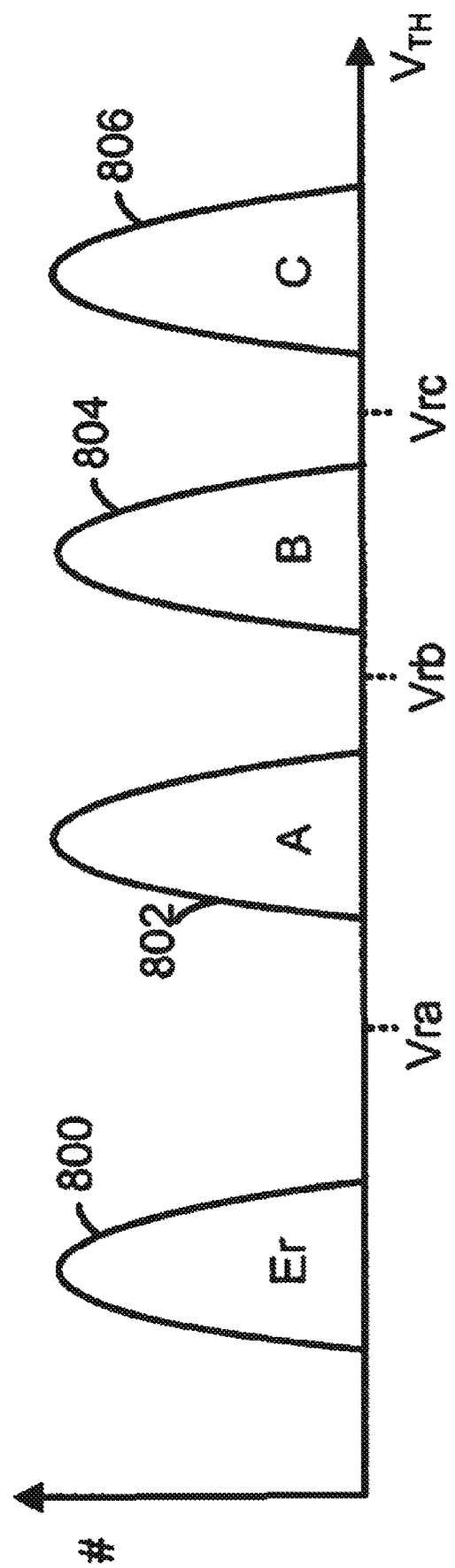
FIG. 7 depicts an example set of threshold voltage distributions according to aspects of the disclosure.

At the end of a successful program process, the threshold voltages of the memory cells should be within one or more distributions of threshold voltages for programmed memory cells or within a distribution of threshold voltages for erased memory cells. FIG. 7 illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state, storing "10." Distribution 804 represents a distribution of threshold voltages of cells that are in a second programmed state, storing "00." Distribution 806 represents a distribution of threshold voltages of cells that are in a third programmed state, storing "01."

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Figure 8:
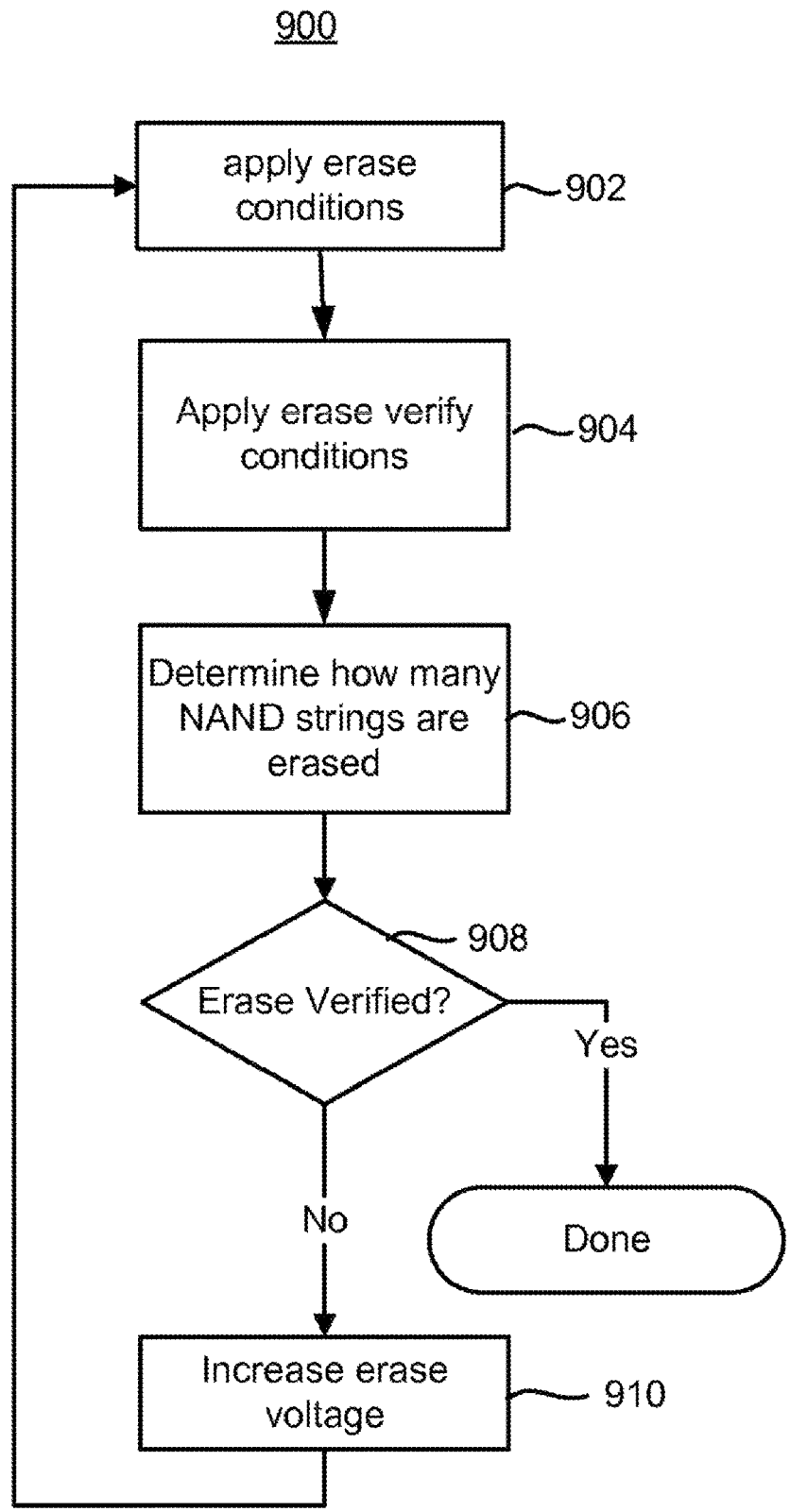
FIG. 8 is a flow chart describing a conventional process for erasing memory cells according to aspects of the disclosure.

FIG. 8 is a flow chart describing a conventional process 900 for erasing memory cells. In step 902, erase conditions are applied to the memory cells. In one embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the $V_{TH}$ of a selected cell is lowered. Erasing can be performed on the entire memory array, on individual blocks, or another unit of cells.

In step 904, a set of erase verify conditions are applied to the memory cells. The target $V_{TH}$ could be positive or negative. In some embodiments, sensing for a positive $V_{TH}$ involves applying a positive reference voltage to word lines and determining whether the NAND string conducts a current in response.

In one implementation, source follower sensing is employed for sensing for a negative $V_{TH}$. Step 904 may include discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string. However, other sensing techniques can be used.

In step 906, each of the NAND strings is sensed to determine whether all of the memory cells on the NAND string were sufficiently erased. Step 906 is performed after waiting for a predetermined period of time for the charge to build up on the bit line, in one embodiment. In one implementation, the voltage on a given bit line is compared to a reference value to determine whether any of the memory cells on the corresponding NAND string have a $V_{TH}$ that is above the target value. The target value could be a negative value. In some implementations, the memory cells are erased to as much as −3V.

In one embodiment, if it is detected that the $V_{TH}$ of each memory cell on a NAND string has reached the target level, then the data stored in the corresponding data latch is changed to a logic "1." If it is detected that the NAND string has at least one memory cell with a $V_{TH}$ that has not reached the appropriate target level, the data stored in the corresponding data latch is not changed.

In step 908, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the process concludes.

If, at step 908, it is determined that erase verification failed, then the erase voltage is increased in step 910. The erase voltage can be increased by any desired amount such as 0.2 V, 0.5 V, 1.0 V, etc. The new erase voltage is applied in step 902.

Figure 9A:
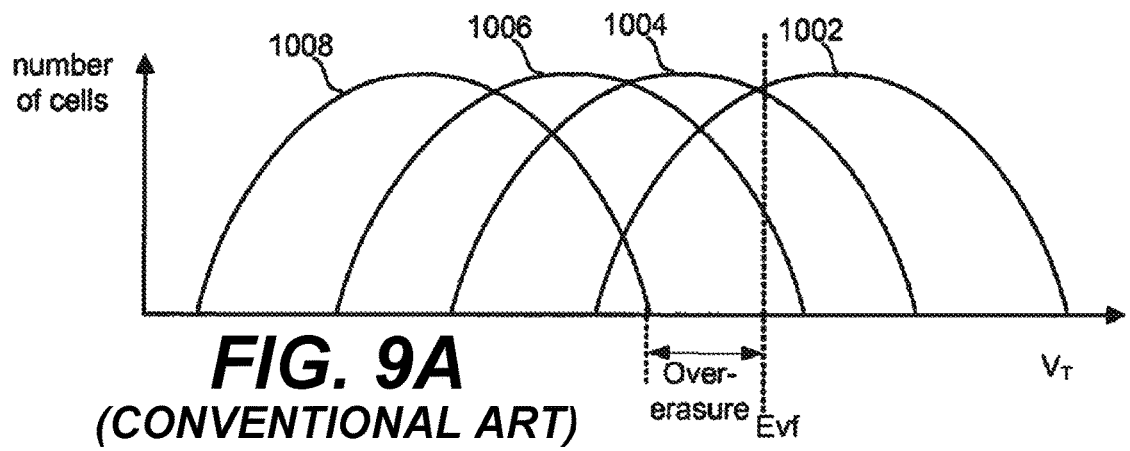
FIGS. 9A-9C depict example threshold distributions during a conventional erase process according to aspects of the disclosure.
Figure 9B:
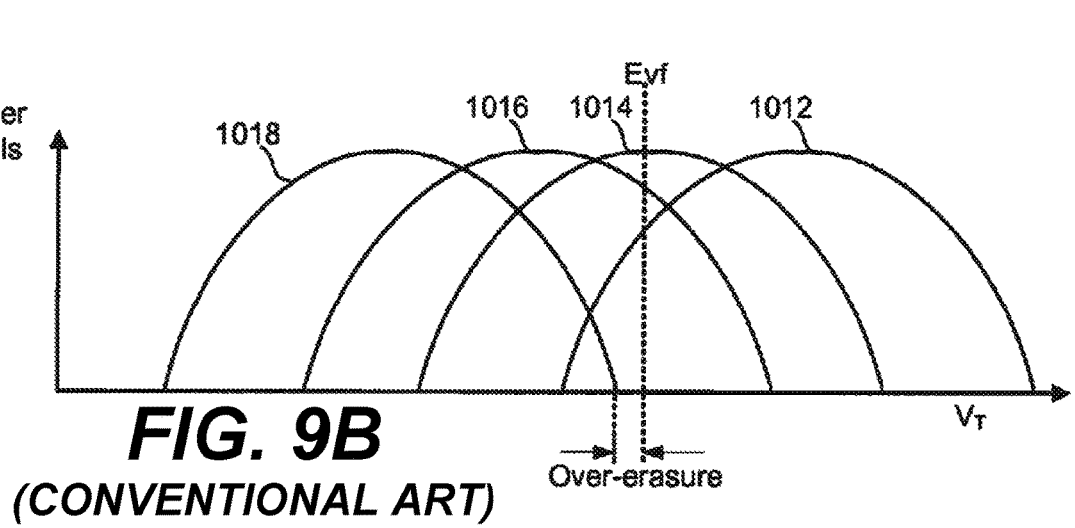
Figure 9C:
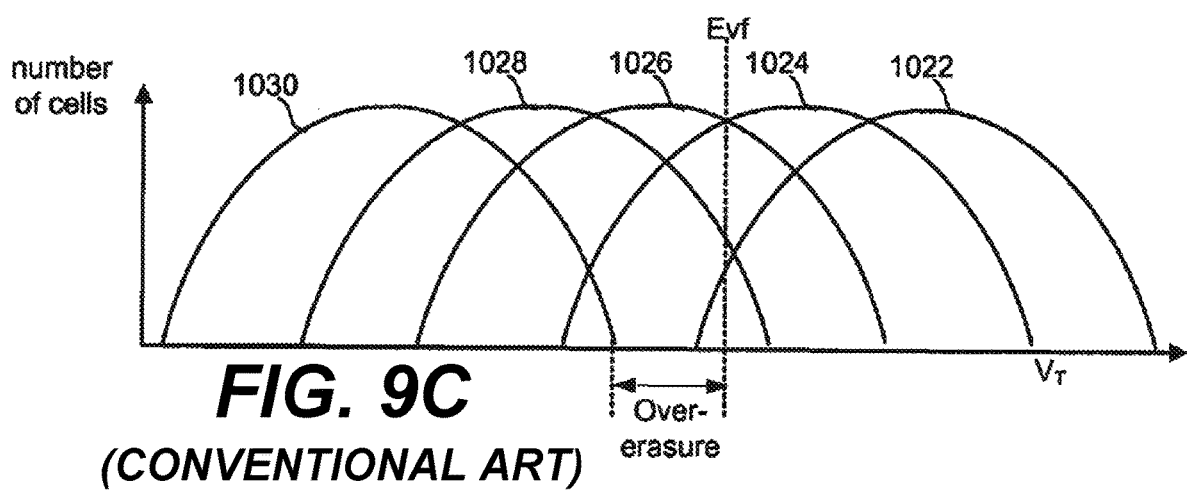

FIGS. 9A-9C depict example threshold distributions during a conventional erase process, such as the one of FIG. 8. FIG. 9A depicts example threshold distributions 1002-1008 at four different stages of an erase procedure. That is, each distribution corresponds to application of one additional erase pulse. Distribution 1002 represents the earliest in time of the four distributions, with 1004, 1006, and 1008 following in that order. Referring back to FIG. 8, these may correspond to the $V_{TH}$ distribution for each loop of process 900. As noted at step 910, the erase voltage may be increased with each iteration. The memory cells are being verified for the threshold voltage level "Evf" in FIG. 9A. This refers to a final $V_{TH}$ level.

The application of each additional erase pulse may move the distribution by a significant amount. As can be seen, a significant number of memory cells have not yet been erased for distributions 1002-1006. In particular, distribution 1006 shows that there are still a significant number of memory cells having a threshold voltage greater than Evf. With the application of one additional erase pulse, the memory cells are moved to distribution 1008. The difference between the upper tail of distribution 1008 and Evf is referred to as "over-erasure." This is because the memory cells did not need to be erased quite so deeply. That is, distribution 1008 could be farther to the right (higher $V_{TH}$) and still pass erase. Note that it is not required that every memory cell has its threshold voltage below Evf for erase to pass. There may be some "outliers" (e.g., memory cells with $V_{TH}$ above Evf) that are not depicted in FIG. 10A. Also, as noted in the discussion of FIG. 8, one technique for verifying the memory cells is to verify on a NAND string basis, as opposed to testing each storage element separately.

Note that for many types of memory cells and erase techniques the distribution of threshold voltages that results from, for example, the first erase pulse changes with use of the memory array. For example, early in the life of the memory, application of a 10V erase pulse may result in a distribution centered at a threshold voltage of 0V. However, after further program/erase cycles the same 10V erase pulse may result in a distribution centered at a threshold voltage of 1V. Thus, a series of pulses that previously could sufficiently erase the memory may later not be sufficient, and more pulses or pulses with higher magnitudes are now required.

FIG. 9B depicts a further example of threshold distributions 1012-1018 at four different stages of an erase procedure. FIG. 9B is for an example after the memory cells have been through additional erase/program cycles relative to the example of FIG. 9A. This example differs from the one of FIG. 9A in that after the first erase pulse is applied, the memory cells are not quite as deeply erased. That is, for distribution 1012 fewer memory cells have their $V_{TH}$ below Evf, compared to distribution 1002. Further note that after the fourth erase pulse, the amount of over-erasure is actually less than for the example of FIG. 9A.

FIG. 9C depicts a further example of threshold distributions 1022-1030 after still more erase/program cycles. In this example, it takes five erase pulses to erase the memory cells. The fifth erase pulse results in a significant over-erasure. Note that the amount of over-erasure can change as a function of the number of erase cycles. Also, the amount of over-erasure can actually oscillate between significant over-erasure, low over erasure, significant over-erasure, etc.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 11C:
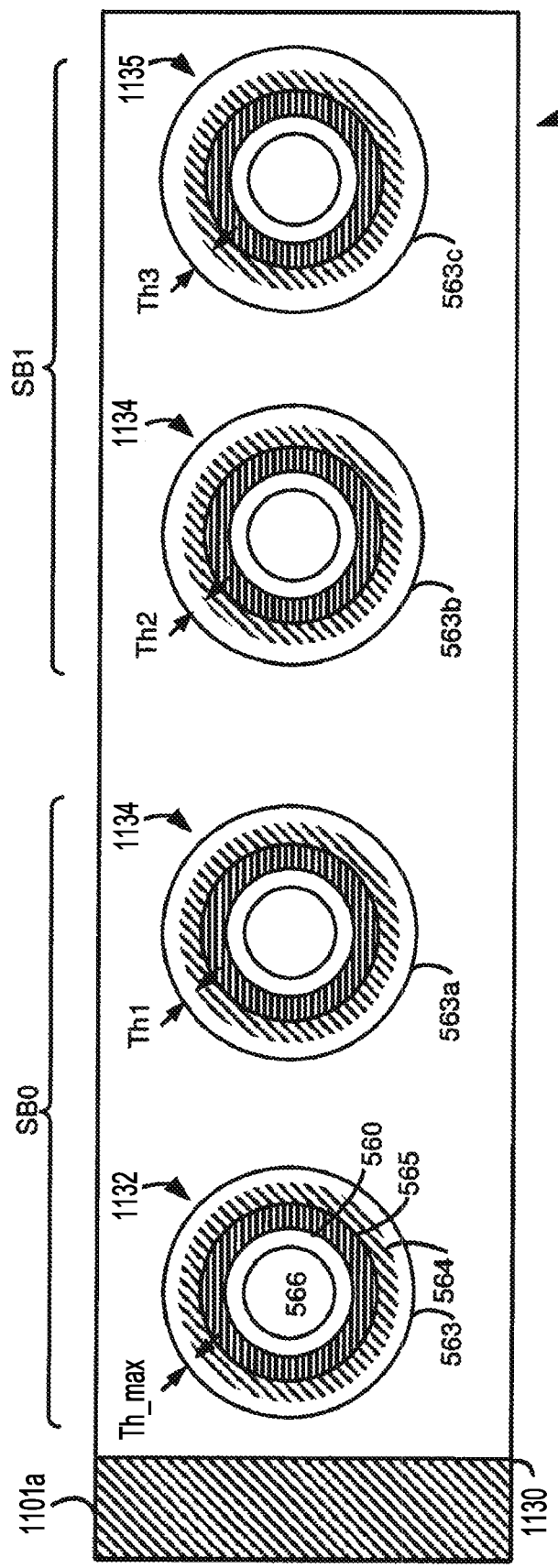
FIG. 11C depicts a region of FIG. 11A in further detail, showing the varying thickness of a blocking oxide layer according to aspects of the disclosure.

As mentioned, the thickness of the blocking oxide layer can vary across a block, in different sub-blocks and in different rows of a sub-block, as described further, e.g., in connection with FIGS. 11B and 11C.

Figure 10A:
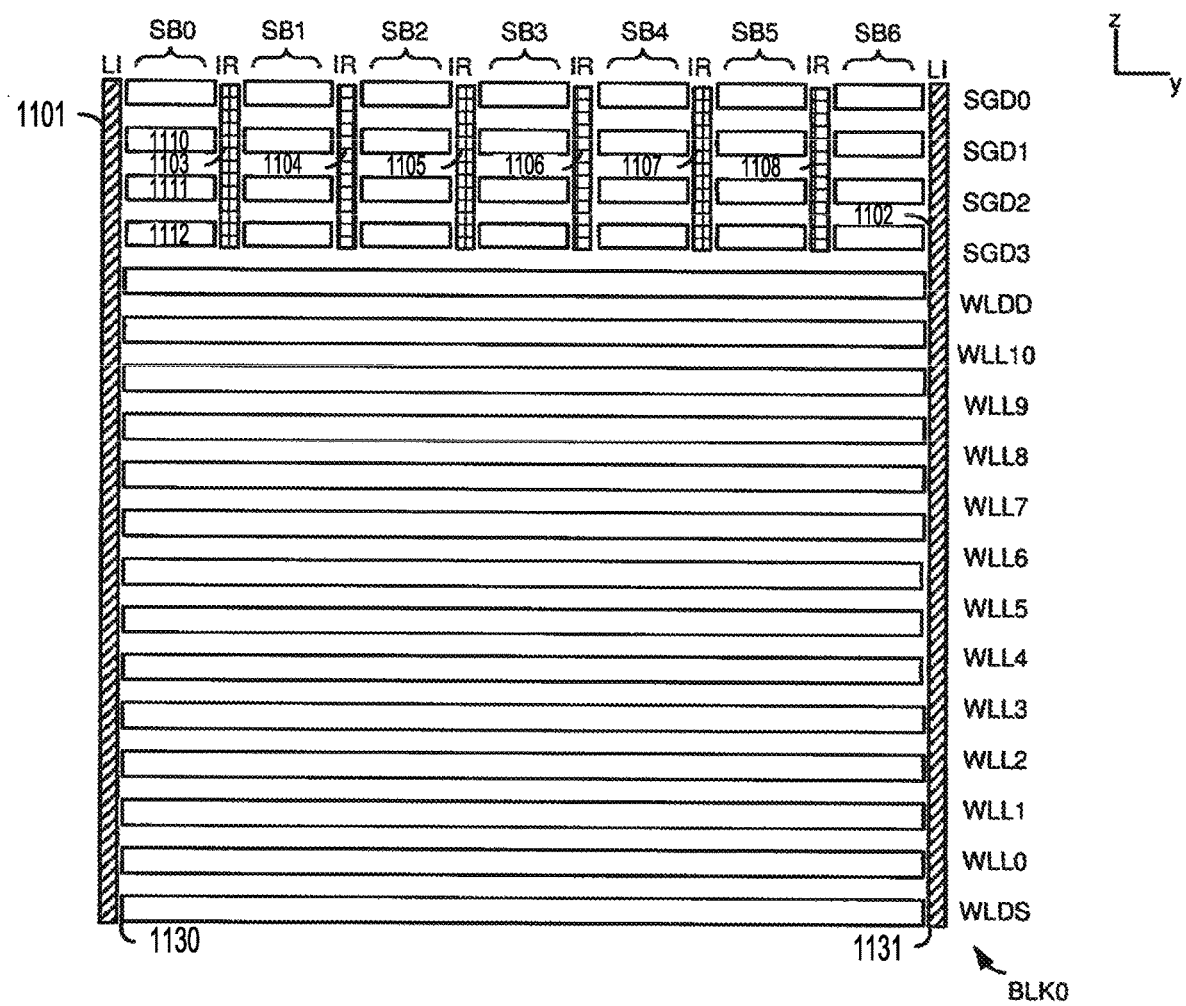
FIG. 10A depicts a side view of the block of FIG. 4 in an example in which the block has seven sub-blocks according to aspects of the disclosure.

FIG. 10A depicts a side view of the block BLK0 of FIG. 4 in an example in which the block has seven sub-blocks, SB0-SB6. This is an example of an odd number of sub-blocks in a block so that there is a single central sub-block, SB3. In another option, a block has an even number of sub-blocks and there are two central sub-blocks. The block comprises a plurality of word lines layers or control gate layers spaced apart vertically in a stack between local interconnects (LI) 1101 and 1102. Each sub-block has one or more separate SGD layers or conductive plates. In this example, each sub-block has four SGD layers, consistent with FIG. 5A. For example, SB0 has first through fourth SGD layers 1109-1112, respectively. The SGD layers of the different sub-blocks are separated by isolation regions (IR) 1103-1108 in this example. In some cases, the SGD layers within a sub-block can be connected to one another, so that SGD transistors have a common control gate voltage. In some cases, the SGD layers in different sub-blocks can be connected to one another. The layers can be connected by conductive paths in the block, or outside the block.

The block also comprises a plurality of word lines layers spaced apart vertically between the local interconnects. The local interconnects are adjacent to opposing edges 1130 and 1131 of the block at which an etchant is introduced in the fabrication process. In one approach, a local interconnect comprises metal surrounded by an insulation to provide an insulated conductive path from the top of the stack to the substrate. In another approach, a local interconnect is replaced by an isolation region (e.g., insulation such as oxide with no metal) which does not provide a conductive path through the stack.

Figure 10B:
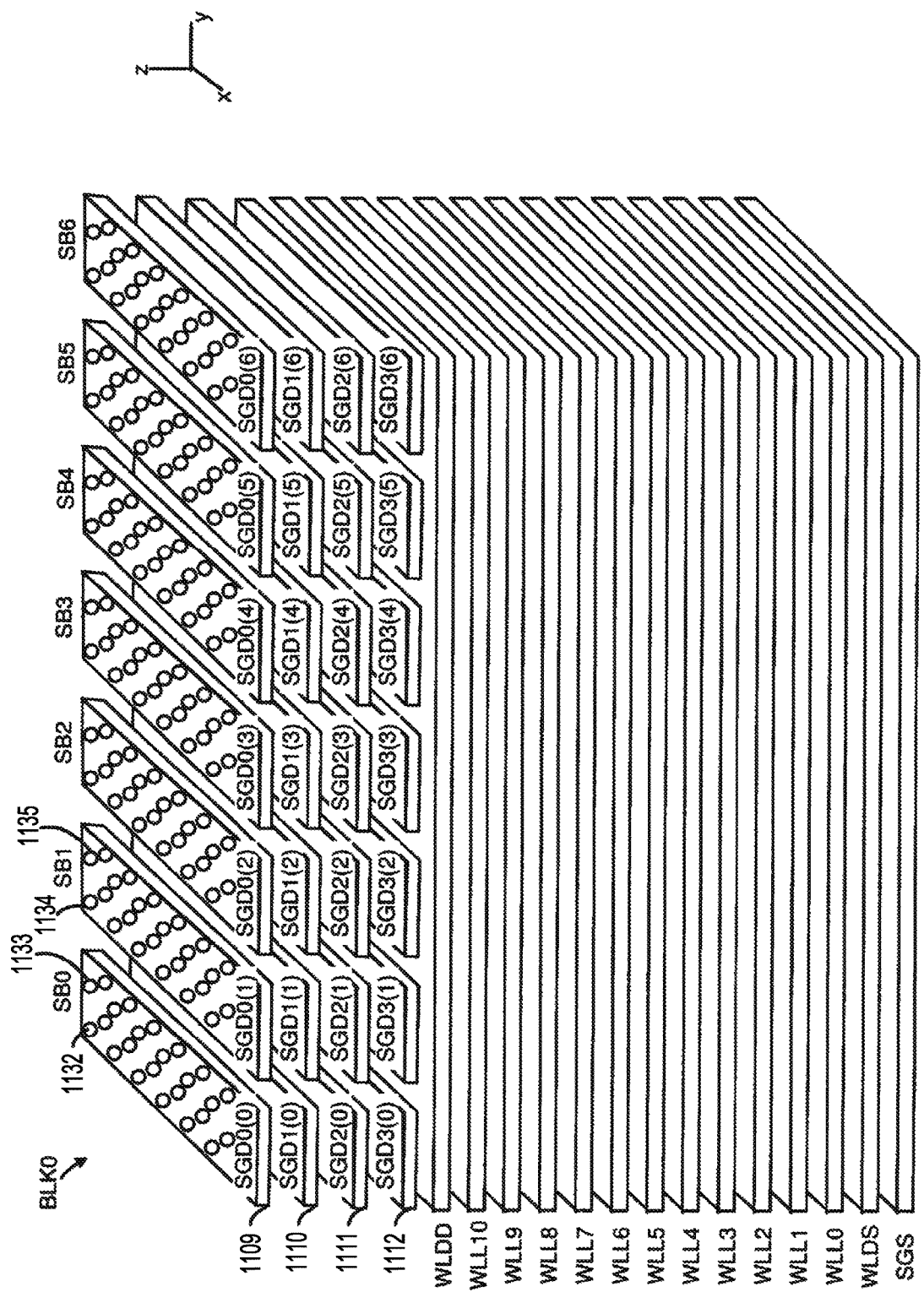
FIG. 10B depicts a perspective view of the conductive layers in the block of FIG. 10A according to aspects of the disclosure.

FIG. 10B depicts a perspective view of the conductive layers in the block BLK0 of FIG. 10A. The control gate layers are arranged in a stack 1200 and include dummy word lines layers or control gate layers WLDS0 and WLDD, and data word line layers or control gate layers WLL0-WLL10, which are shared among the different sub-blocks SB0-SB6. Each control gate layer can be a rectangular plate with a height, width and length in the z, y and x direction, respectively. The width of the SGD plate is less than the width of the control gate layer plates of the memory cells. The length of the SGD plate can be the same as the length of the control gate layer plates of the memory cells. The height of the SGD plate can be the same as, or similar to, the height of the control gate layer plates of the memory cells. This example includes seven sub-blocks as an example, but the erase techniques described herein generally apply to the case of two or more sub-blocks in a block.

Moreover, this example assumes that etchant is introduced at two opposing sides of the block, so that the blocking oxide layer is thinnest at the two opposing sides, but other approaches are possible. For example, the etchant can be introduced at one side of the block, so that the blocking oxide layer is thinnest at the one side and become progressively thicker moving away from the one side.

The control gate layers include a common SGS control gate layer for the block, and separate SGD control gate layers for each sub-block. For example, SB0, SB1, SB2, SB3, SB4, SB5 and SB6 include control gate layers SGD0(0)-SGD3(0), SGD0(1)-SGD3(1), SGD0(2)-SGD3(2), SGD0(3)-SGD3(3), SGD0(4)-SGD3(4), SGD0(5)-SGD3(5), and SGD0(6)-SGD3(6), respectively.

Additionally, several example memory holes or NAND strings are depicted by circles at the top of each sub-block, in a simplified example. Example NAND strings 1132 and 1133 in SB0 and NAND strings 1134 and 1135 in SB1 are depicted, consistent with FIGS. 11A and 11C. The sub-blocks of FIG. 10B each include 24 memory holes or NAND strings in four rows in a simplified example which is consistent with FIG. 11A.

FIG. 11A depicts a top view of the example block BLK0 of FIG. 10B, where each sub-block comprise four rows of NAND strings. The drain end of each NAND string or memory hole (such as the example NAND strings 1132, 1133, 1134 and 1135) is represented by an open circle and a solid circle represents a connection of a bit line to the drain end of the NAND string. Bit lines BL0-BL23 extend in the y-direction across the block, parallel to one another, and spaced apart from one another in the x direction. Each bit line is connected to one NAND string in each sub-block. Additionally, the NAND strings extend in multiple rows in each sub-block, such as rows R1-R4 in SB0 and 1R-4R in SB6. Accordingly, each word line layer of the sub-block comprises corresponding multiple rows of memory cells.

In this example, there are four rows per sub-block, but there could be fewer or more. A thickness of the blocking oxide layer is less for one row (e.g., R1) than another row (e.g., R4) in SB0 when the closest edge 1130 of the block is closer to the one row than to the another row. Similarly, a thickness of the blocking oxide layer is less for one row (e.g., 1R) than another row (e.g., 4R) in SB6.

The configuration shown provides a higher density of NAND strings compared to using just one row of NAND string per sub-block, although the techniques described herein can also be used with just one row of NAND strings per sub-block.

The rows and sub-blocks are at various distances from a closest edge of the block. For example, SB0-SB3 are at distances of d1-d3, respectively, from the closest edge 1130, and SB6-SB4 are at distances of d1-d3, respectively, from the closest edge 1131. The central sub-block, SB3, is at the same distance d4 from either edge 1130 or 1131. The distance can be taken at the midpoint of a sub-block to the edge, in one approach. In SB0, the rows R1-R4 of NAND strings are at distances d1a-d1d, respectively, from the edge 1130. In SB6, the rows 1R-4R of NAND strings are at distances d1a-d1d, respectively, from the edge 1131.

In one approach which allows for adjusting the erase speeds of different rows in a sub-block, the even-numbered bit lines are connected to a first set of rows of NAND strings in each sub-block, and the odd-numbered bit lines are connected to a second set of rows of NAND strings in each sub-block. Moreover, in each sub-block, the first set of rows of NAND strings have a higher erase speed than the second set of rows of NAND strings. That is, in each sub-block, a closest edge of the block is closer to the first set of rows of NAND strings than to the second set of rows of NAND strings, and the first set of rows of NAND strings have a smaller blocking oxide layer thickness than the second set of rows of NAND strings. In other words a distance between the first set of rows and the closest edge is less than a distance between the second set of rows and the closest edge.

For instance, in SB0, R1 and R2 are in a first set of rows and are connected to the even-numbered bit lines of BL0-BL22. For instance, the NAND string 1132 in R2 is connected to BL22. R3 and R4 are in a second set of rows and are connected to the odd-numbered bit lines of BL1-BL23. For instance, the NAND string 1133 in R4 is connected to BL23.

Similarly, in SB6, 1R and 2R are in a first set of rows and are connected to the even-numbered bit lines of BL0-BL22, and 3R and 4R are in a second set of rows and are connected to odd-numbered bit lines of BL1-BL23.

The rows are not labelled in SB1-SB5. However, the rows of SB1 and SB2 follow the pattern of SB0, where the two left hand rows of each sub-block are the faster erasing rows and are connected to the even-numbered bit lines, and the two right hand rows of each sub-block are the slower erasing rows and are connected to the odd-numbered bit lines. The rows of SB4 and SB5 follow the pattern of SB6, where the two right hand rows of each sub-block are the faster erasing rows and are connected to the even-numbered bit lines, and the two left hand rows of each sub-block are the slower erasing rows and are connected to the odd-numbered bit lines. The rows of the central sub-block SB3 are depicted as following the pattern of SB0 but could alternatively follow the pattern of SB6.

To equalize the erase depth of the faster and slower erasing rows or sets of rows of each sub-block, a higher erase voltage can be applied to the slower-erasing rows.

See also FIG. 11C for further details of a region 1140 of the block.

FIG. 11B depicts a plot showing a varying thickness of a blocking oxide layer in the block of FIG. 11A as a function of a distance from a nearest edge of the block. The vertical axis depicts a thickness and the horizontal axis depicts a position along the y direction of the block of FIG. 11A. The thickness ranges from a maximum, Th_max, at the edges 1130 and 1131, where SB0 and SB6, respectively, are located and decreases to a minimum, Th_min, at the center of the block, where SB3 is located.

FIG. 11C depicts the region 1140 of FIG. 8A in further detail, showing the varying thickness of a blocking oxide layer. The region includes four example NAND strings, including NAND strings 1132 and 1133 in SB0, and the NAND strings 1134 and 1135 in SB1. The edge 1130 and a portion 1101a of the local interconnect are also depicted. The NAND string 1132 includes the components depicted in FIG. 6, including the blocking oxide layer 563, the charge-trapping layer 564, the tunneling layer 565, the channel 560 and the dielectric core 566. The thickness of the blocking oxide layers 563, 563a, 563b and 563c decreases progressively from Th_max, Th1, Th2 to Th3 for the NAND strings 1132, 1133, 1134 and 1135, respectively.

Figure 12B:
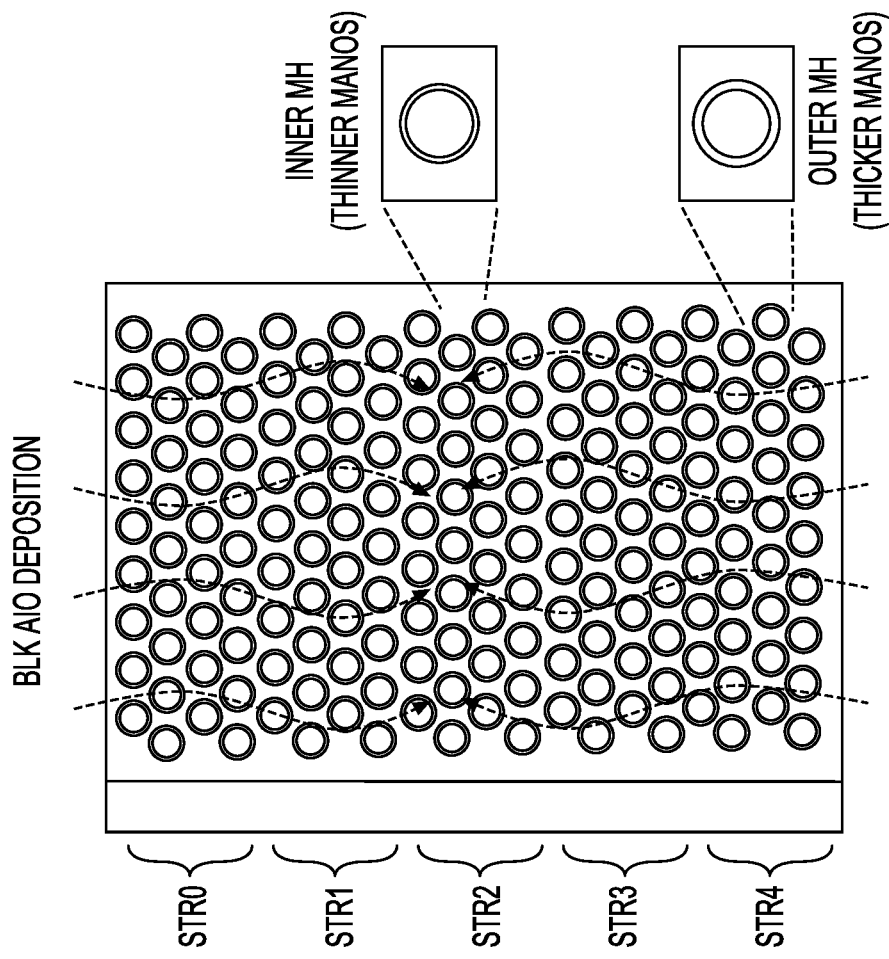
FIG. 12B shows a top view of another example block representative of later generation memory apparatuses.
Figure 12A:
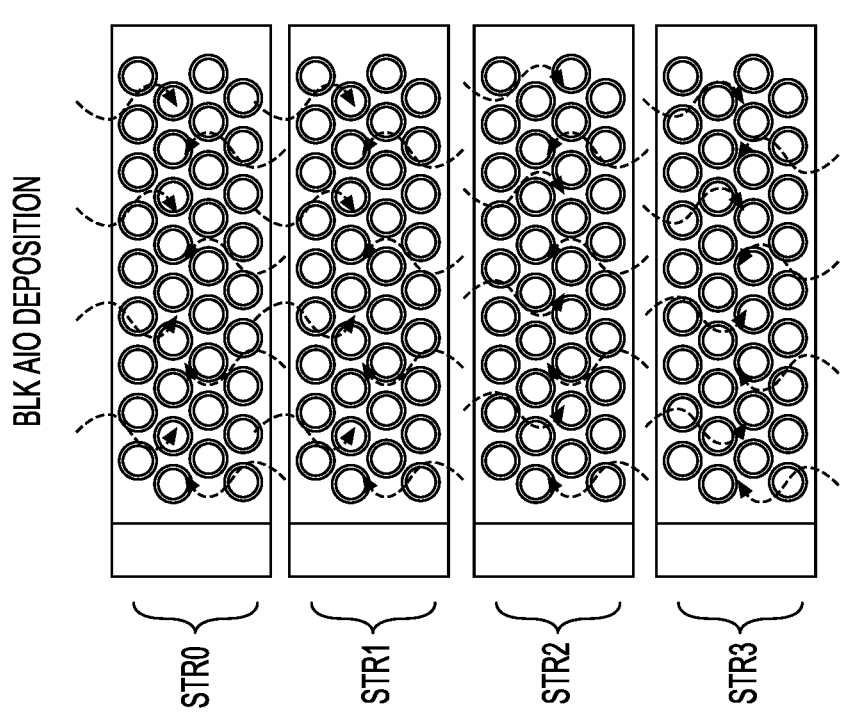
FIG. 12A shows a top view of an example block representative of earlier generation memory apparatuses.

As previously discussed, referring to FIGS. 12A-12B and back to FIG. 6, the blocking oxide layer thickness associated with the position of strings in a block can cause different strings or memory holes of a block to have different erase speeds based on the positions of the strings in the block. Specifically, in Bit Cost Scalable (BiCS) technology, cell structures are formed by depositing "blocking AIO" or blocking oxide layers through a hollow structure (pre-filled by SiN and later replaced by tungsten). In this deposition process, AIO chemicals need to travel from edge of wordline (ST trench) from outer memory holes (MH) to inner memory holes. Since the outer memory holes encounter the chemicals earlier than the inner memory holes, the outer memory holes typically have thicker oxide. Such thicker metal-alumina-nitride-oxide-silicon (MANOS) layer in the outer memory holes leads to slower erase speed, while thinner MANOS layer in the inner memory holes leads to faster erase speed. So, it is clear that the larger the distance between outer memory holes and inner memory holes, the more difference that is expected for the erase speed. FIG. 12A shows a top view of an example block representative of earlier generation memory apparatuses (e.g., BiCS 2/3/4). As shown for the earlier generation memory apparatuses, the distance from outer memory holes to inner memory holes is only 2 rows. However, as best shown in FIG. 12B, which shows a top view of another example block representative of later generation memory apparatuses (e.g., BiCS 6), the distance from outer memory holes to inner memory holes becomes 12 rows. The actual erase speed difference between different rows become significantly large (>300 a.u., see FIG. 14). This means inner strings will be over-erased, which will cause (1) worse endurance for inner strings, (2) worse data retention for inner string memory cells (more lateral charge diffusion during high temperature data retention (HTDR)), (3) potential defect parts per million (dppm) issue for inner strings due to over-erasure.

Figure 13A:
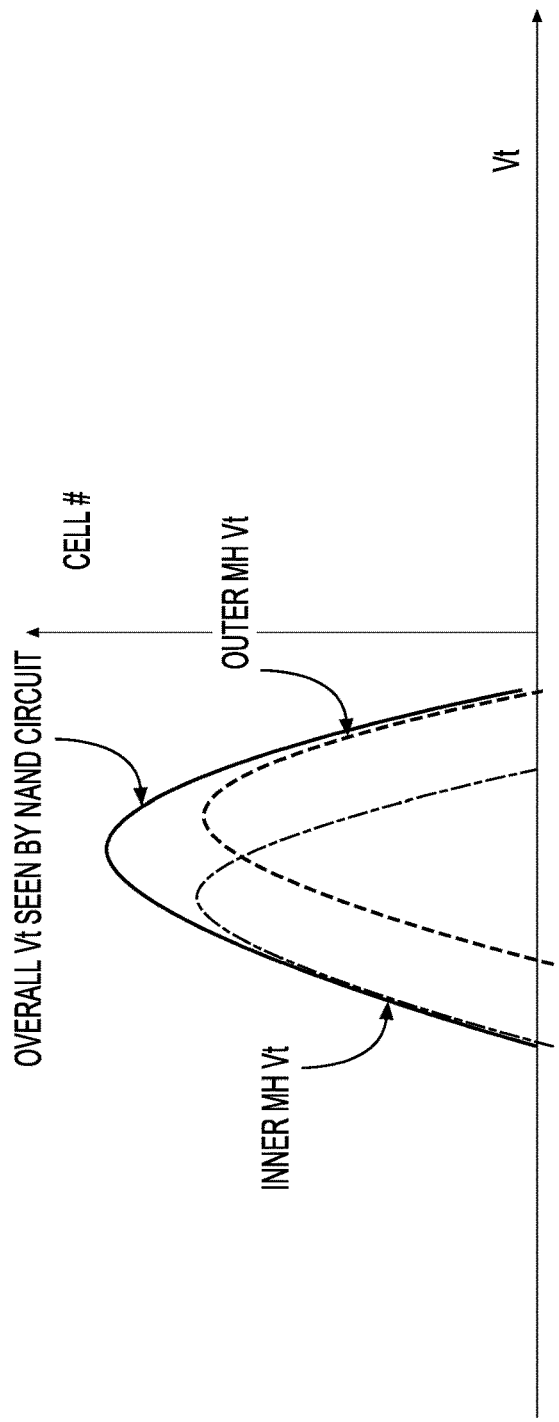
FIGS. 13A and 13B show example outer memory hole threshold voltage distributions and inner memory hole threshold voltage distributions that together form total threshold voltage distributions according to aspects of the disclosure.
Figure 13B:
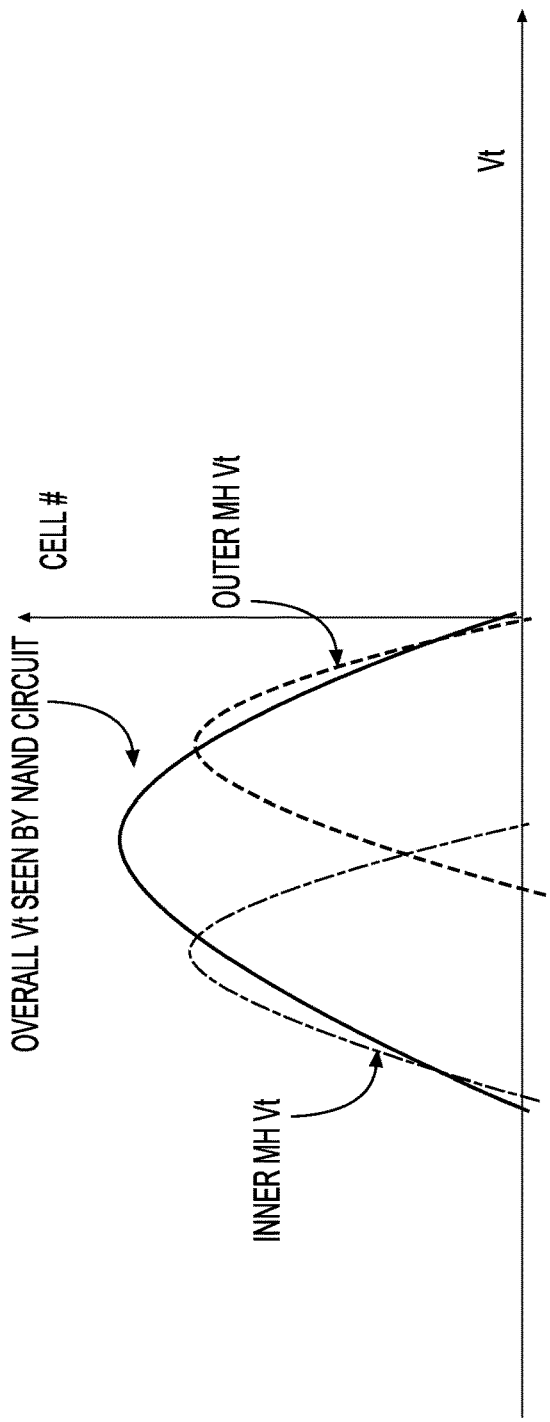
Figure 14:
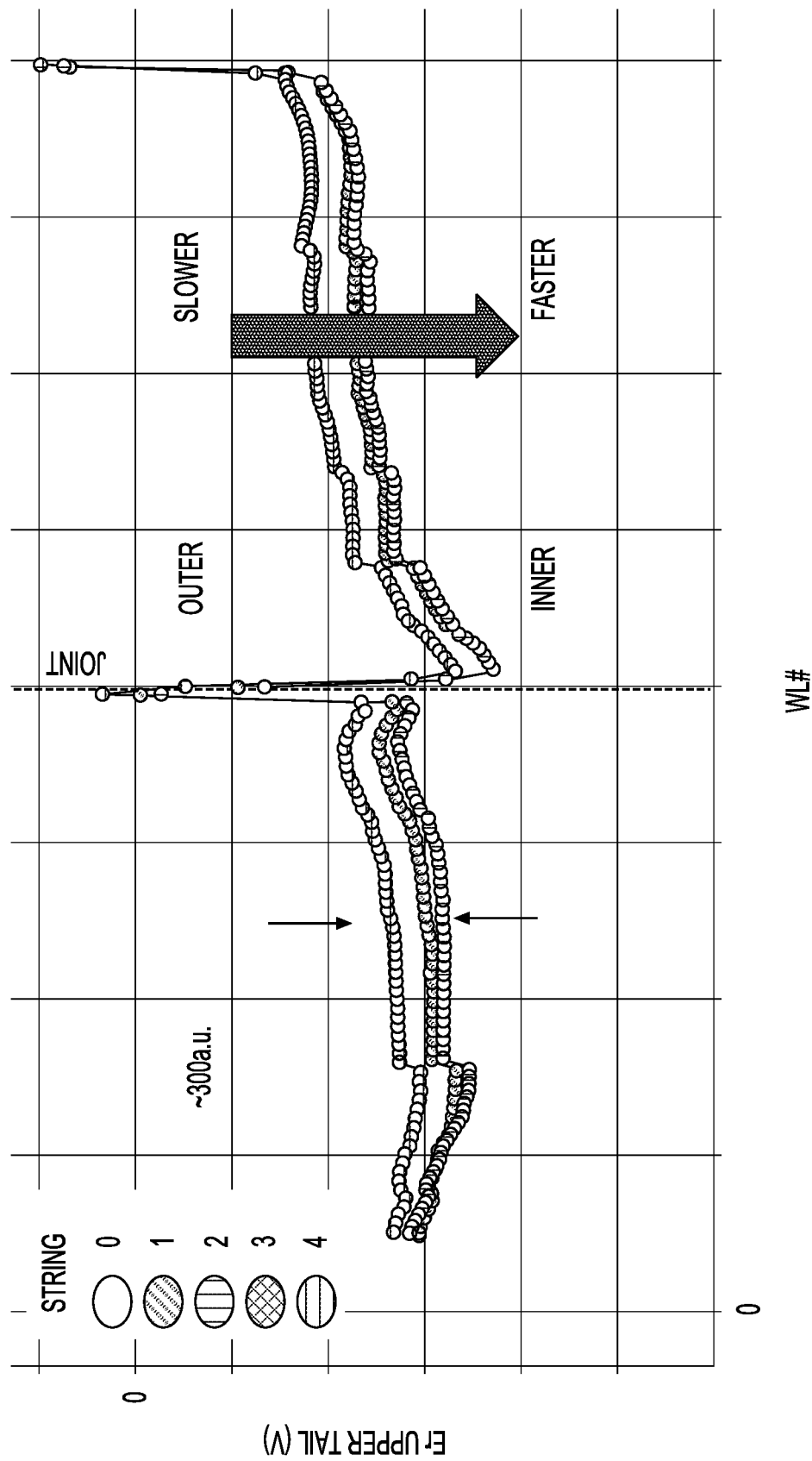
FIG. 14 shows a plot of an erase upper tail voltage versus word line number for five strings according to aspects of the disclosure.

FIGS. 13A and 13B show example outer memory hole threshold voltage Vt distributions and inner memory hole threshold voltage Vt distributions that together form a total threshold voltage Vt distribution "seen" by the memory control circuit (i.e., when reading the corresponding memory cells). Specifically, FIG. 13A is representative of earlier generation memory apparatuses (e.g., BiCS2) and FIG. 13B is representative of later generation memory apparatuses (e.g., BiCS6). When the distributions for the inner memory hole threshold voltage Vt and outer memory hole threshold voltage Vt are very different, the total threshold voltage Vt distribution is much wider (later generation memory apparatuses). This causes severe program performance degradation. FIG. 14 shows a plot of an erase upper tail voltage versus word line number for five strings (later generation memory apparatuses such as BiCS6, for example). The erase speed is defined as +2.5sigma upper tail after 1-pulse erase with an erase voltage VERA of 17.8 volts. As shown, the inner string erase speed is faster (deeper) by approximately 0.3 a.u. than the outer string (strings 0 and 4 are outer strings and strings 2, 3, and 4 are inner strings). The innermost string 2 is the fastest string to erase, followed by inner string 0/1, with outer string 3/4 being the slowest string to erase. The inner strings have thinner BLK ALO & SiO than the outer strings, and thus better coupling. Consequently, the inner strings erase faster than the outer strings.

Accordingly, provided herein is a memory apparatus (e.g., memory device 100 of FIG. 1) including a block of memory cells (e.g., transistor 549 of FIG. 5B). Each of the memory cells is connected to one of a plurality of word lines (e.g., word line layers WLL0-WLL10 of FIG. 5A) and arranged in strings or NAND strings (e.g., NAND string 700n of FIG. 5A). The memory cells are configured to retain a threshold voltage Vt or $V_{TH}$ corresponding to one of a plurality of data states (e.g., distributions 800-806 of FIG. 7) and be erased in an erase operation. A control circuit (e.g., any one of, or a combination of, control circuitry 110, state machine 112, decoders 114 and 132, power control module 116, sense blocks 51, 52, . . . , 53, read/write circuits 128, controller 122, etc. of FIG. 1) is coupled to the plurality of word lines and the strings and is configured to identify ones of the strings having a faster relative erase speed compared to others of the strings. During the erase operation, the control circuit is configured to raise the threshold voltage Vt of the memory cells associated with the ones of the strings having the faster relative erase speed while not raising the threshold voltage Vt of the memory cells associated with the others of the strings. So, the control circuit is configured to program the memory cells associated with the ones of the strings having the faster relative erase speed.

Figure 15B:
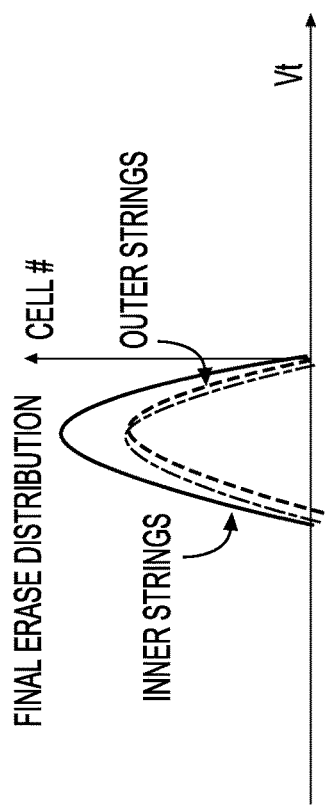
FIG. 15B shows another final erase threshold voltage distribution for memory cells using an erase operation including programming of memory cells associated with ones of the strings having the faster relative erase speed during the erase operation according to aspects of the disclosure.
Figure 15A:
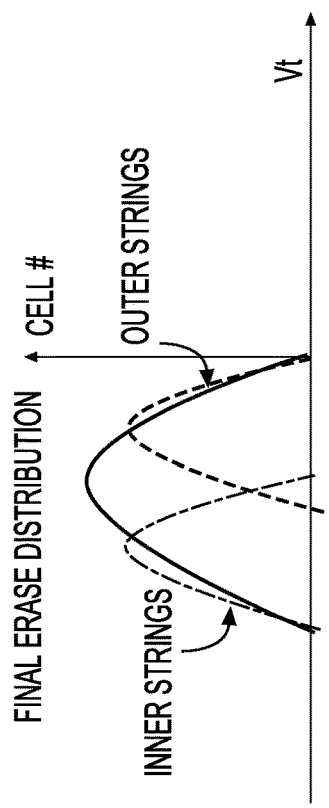
FIG. 15A shows a final erase threshold voltage distribution for memory cells using a conventional erase operation as shown in FIG. 8.

Specifically, according to an aspect, such programming can be done after one erase pulse, but before a second erase pulse. FIG. 15A shows a final erase threshold voltage Vt distribution for memory cells using a conventional erase operation (e.g., as shown in FIG. 8). In contrast, FIG. 15B shows another final erase threshold voltage Vt distribution for memory cells using an erase operation including the programming of the memory cells associated with the ones of the strings having the faster relative erase speed during the erase operation. As shown, the resulting higher threshold voltage Vt for the ones of the strings having the faster relative erase speed decelerates the erase speed for these strings and can avoid over-erase during/after the second erase pulse. Such an approach benefits from an "Erase Dispersion Effect" to compensate the string dependent erase speed.

During the erase operation, the control circuit is further configured to apply a first erase pulse of an erase voltage VERA to the strings while simultaneously applying a word line erase voltage to the plurality of word lines (e.g., applying approximately 0 volts or grounding the word lines) in response to receiving an erase command. The control circuit is also configured to select the ones of the strings having the faster relative erase speed and unselect the others of the strings. In addition, the control circuit is configured to apply a predetermined programming voltage VPGM to the memory cells associated with the ones of the strings having the faster relative erase speed while not applying the predetermined programming voltage VPGM to the memory cells associated with the others of the strings. The control circuit is additionally configured to apply one of a plurality of subsequent erase pulses of the erase voltage VERA to the strings while simultaneously applying the word line erase voltage to the plurality of word lines. The control circuit also is configured to apply an erase verify voltage to each the plurality of word lines and sense to determine whether the threshold voltage Vt of the memory cells is below an erase-verify level representing an erased state of the plurality of data states (e.g., Evf of FIG. 9A) during a verify portion of the erase operation.

The control circuit determines whether a quantity of the strings associated with memory cells having the threshold voltage Vt below the erase-verify level is greater than a predetermined quantity of the strings to pass the verify portion of the erase operation. The control circuit increases the erase voltage VERA by a delta erase voltage ΔVERA and returns to apply one of the plurality of subsequent erase pulses of the erase voltage VERA to the strings while simultaneously applying the word line erase voltage to the plurality of word lines in response to the quantity of the strings associated with memory cells having the threshold voltage Vt below the erase-verify level not being greater than the predetermined quantity of the strings to pass the verify portion of the erase operation. The control circuit concludes the erase operation in response to the quantity of the strings associated with memory cells having the threshold voltage Vt below the erase-verify level being greater than the predetermined quantity of the strings to pass the verify portion of the erase operation.

According to an aspect, to identify the ones of the strings having the faster relative erase speed, the control circuit is further configured to apply at least erase pulse of an erase voltage VERA to the strings while simultaneously applying a word line erase voltage to the plurality of word lines. The control circuit is also configured to apply at least one read voltage to the plurality of word lines and count quantities of the memory cells of the strings having the threshold voltage Vt above the at least one read voltage (i.e., count the quantities of the memory cells of the strings in the upper tail of the erase threshold voltage Vt distribution). So, the control circuit identifies the ones of the strings having the faster relative erase speed compared to others of the strings based on the quantities of the memory cells of the strings having the threshold voltage Vt above the at least one read voltage.

Figure 16:
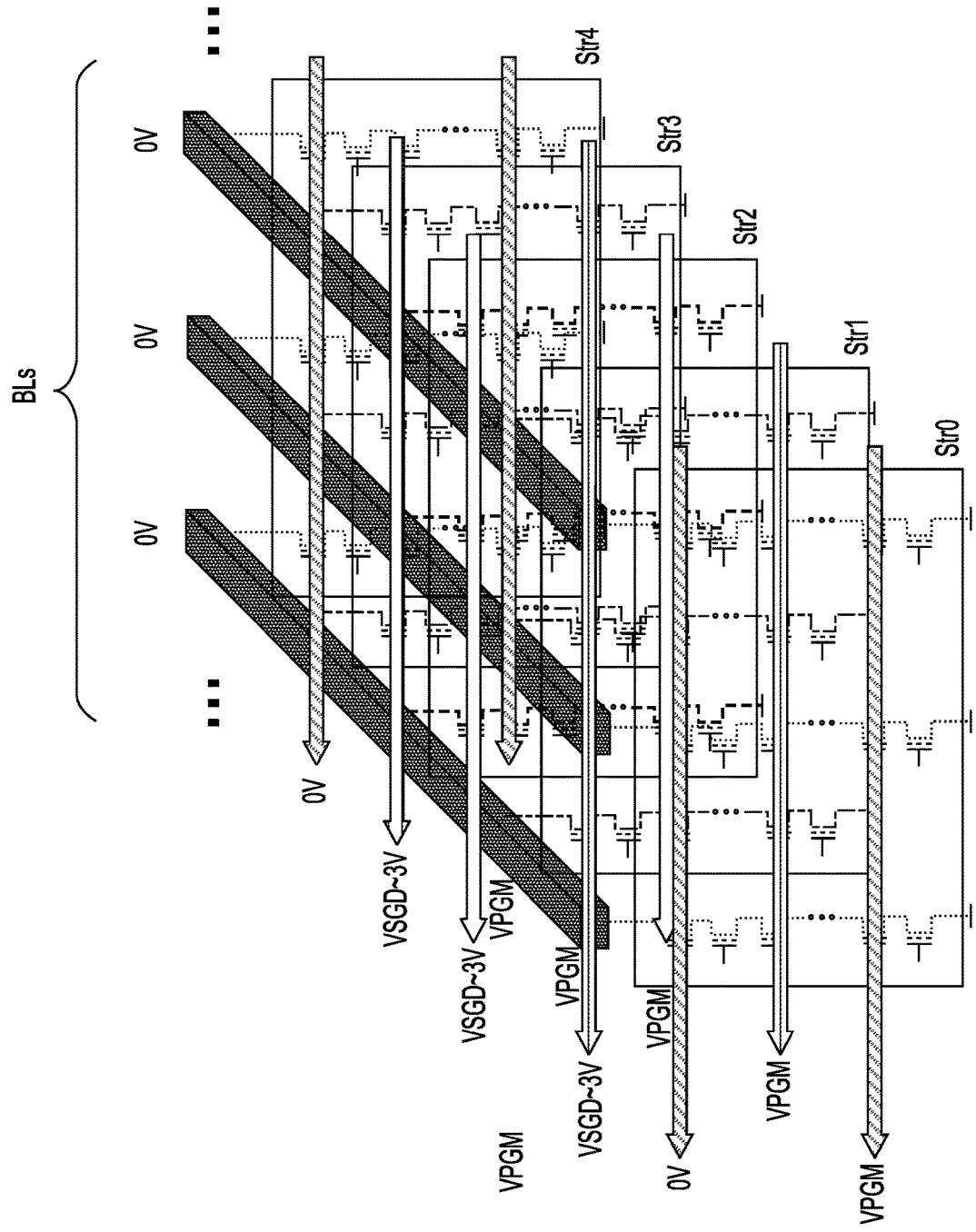
FIG. 16 depicts one embodiment of a block with five strings according to aspects of the disclosure.
Figure 17:
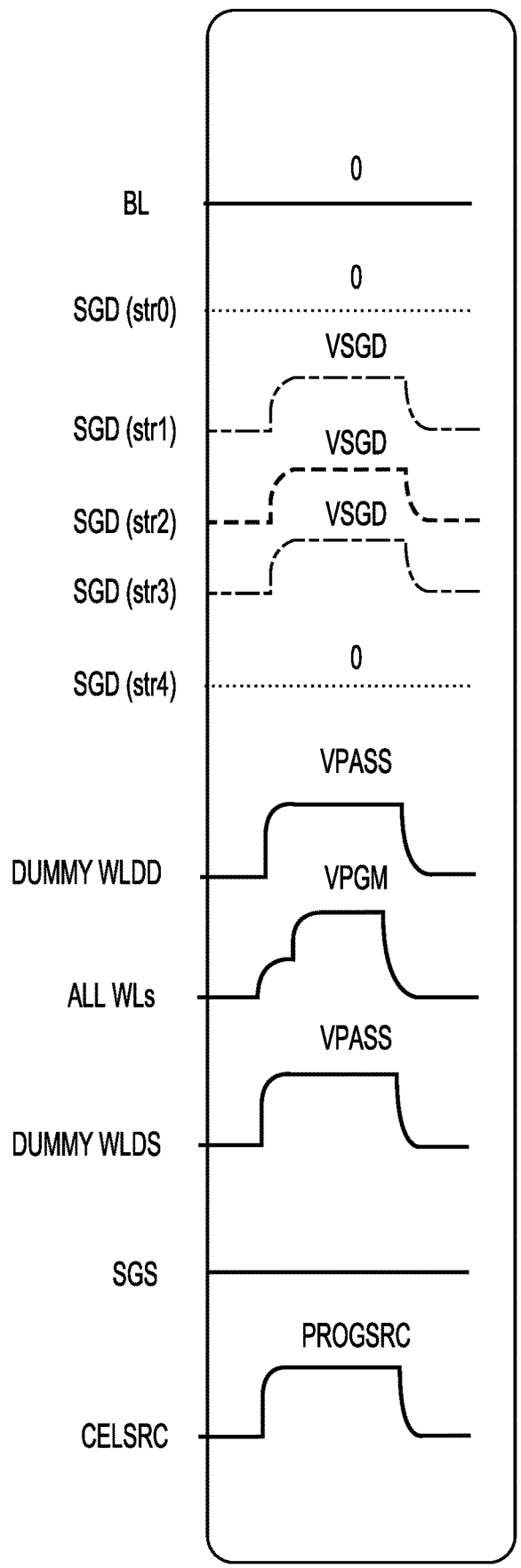
FIG. 17 shows example plots of voltages including a select voltage applied to at least one drain end select gate transistor to select that string while a predetermined programming voltage is applied according to aspects of the disclosure.

As discussed above, and referring to FIGS. 16-18 and back to FIGS. 5B, 6, 10A-10B, and 11A, the plurality of word lines extend horizontally through the block (in the x and y directions) and are spaced apart from one another vertically (in the z direction). The strings extend vertically through the block orthogonally to the plurality of word lines. The block defines opposing edges extending vertically along the block (e.g., opposing edges 1130 and 1131 of FIGS. 10A and 11A). The strings include a plurality of outer strings being disposed horizontally closer to the opposing edges and a plurality of inner strings being horizontally further from the opposing edges than the plurality of outer strings. Each of the strings comprises a memory hole extending vertically through the block and filled with materials including blocking oxide layers to form the memory cells adjacent to each the plurality of word lines. The faster relative erase speed of the ones of the strings compared to others of the strings depends on a horizontal proximity of the strings to the opposing edges of the block due to variation of a thickness of the blocking oxide layers. So, referring specifically, to FIG. 16, which depicts five strings Str0-Str4 or strings 0-4 (groups of NAND strings), according to one example embodiment and includes bit lines connected thereto. The bit lines (indicated as BLs) are set according to data that will be written to storage cells in each of the strings. Although three bit lines (BL) are depicted in FIG. 16, an array of storage cells may, of course, include many more bit lines. Further, although five strings Str0-Str4 are depicted, array of storage cells can include any number of strings or groups of NAND strings. According to an aspect, a concurrent programming component of the control circuit can electrically select a bit line to program cells in a string connected to the bit line.

Examples of concurrent programming are set forth in U.S. Pub. No. 2020/0005871, which is incorporated herein by reference.

The control circuit is further configured to select the plurality of inner strings and unselect the plurality of outer strings while applying the predetermined programming voltage VPGM to the plurality of word lines during the erase operation. Each of the strings includes the memory cells is connected in series between at least one drain end select gate transistor (e.g., formed in first through four SGD layers, SGD0-SGD3 of FIG. 5A) on a drain end (e.g., drain-end 515 of FIG. 5A) of the each of the strings connected to a bit line and at least one source end select gate transistor (e.g., formed in the SGS layer of FIG. 5A) on a source end (e.g., source-end 513 of FIG. 5A) of the each of the strings connected to a source line (e.g., SL of FIG. 5A). The control circuit is further configured to select the plurality of inner strings by applying a select voltage VSGD (e.g., −3 volts) to the at least one drain end select gate transistor associated with each of the plurality of inner strings. So, referring to FIG. 17, for the plurality of inner strings, the select voltage VSGD is applied to the at least one drain end select gate transistor SGD to "select" that string, so the entire string will be programmed up by the predetermined programming voltage VPGM. According to an aspect, the predetermined programming voltage VPGM may be relatively low, just enough to program slightly higher than the plurality of outer strings. It should be appreciated that the application of the predetermined programming voltage VPGM may be done concurrently or to all of the plurality of inner strings at once (e.g., using the concurrent programming component mentioned above). The control circuit is also configured to unselect the plurality of outer strings by applying an unselect voltage (e.g., 0 volts) to the at least one drain end select gate transistor associated with each of the plurality of outer strings. In other words, for the plurality of outer strings, the unselect voltage is applied to the at least one drain end select gate transistor SGD to "unselect" that string, so the channel will be cut off on both the source/drain sides. The boosting from Vpass will help inhibit the plurality of outer strings. Therefore, as shown in FIGS. 18A and 18B, after one pulse, the threshold voltage Vt of the memory cells of the plurality of inner strings (str1/2/3) will be higher while the threshold voltage Vt of the memory cells of the plurality of outer strings (str0/4) will stay low. This compensates/decelerates inner string erase speed in subsequent pulses.

In further detail, during the erase operation, the control circuit is configured to apply a first erase pulse of an erase voltage VERA to the strings while simultaneously applying a word line erase voltage to the plurality of word lines (e.g., grounding or applying approximately 0 volts to the word lines) in response to receiving an erase command. In addition, the control circuit is configured to apply the predetermined programming voltage VPGM to the memory cells associated with the plurality of inner strings while not applying the predetermined programming voltage VPGM to the memory cells associated with the plurality of outer strings. The control circuit is also configured to apply one of a plurality of subsequent erase pulses of the erase voltage VERA to the strings while simultaneously applying the word line erase voltage to the plurality of word lines. Additionally, the control circuit is configured to apply an erase verify voltage to each the plurality of word lines and sense to determine whether the threshold voltage Vt of the memory cells is below an erase-verify level representing an erased data state of the plurality of data states during a verify portion of the erase operation.

The control circuit determines whether a quantity of the strings associated with memory cells having the threshold voltage Vt below the erase-verify level is greater than a predetermined quantity of the strings to pass the verify portion of the erase operation. The control circuit then increases the erase voltage VERA by a delta erase voltage ΔVERA and return to apply one of the plurality of subsequent erase pulses of the erase voltage VERA to the strings while simultaneously applying the word line erase voltage to the plurality of word lines in response to the quantity of the strings associated with memory cells having the threshold voltage Vt below the erase-verify level not being greater than the predetermined quantity of the strings to pass the verify portion of the erase operation. The control circuit concludes the erase operation in response to the quantity of the strings associated with memory cells having the threshold voltage Vt below the erase-verify level being greater than the predetermined quantity of the strings to pass the verify portion of the erase operation.

Referring now to FIGS. 19 and 20, a method of operating a memory apparatus (e.g., memory device 100 of FIG. 1) is also provided. As above, the memory apparatus includes including a block of memory cells (e.g., transistor 549 of FIG. 5B). Each of the memory cells is connected to one of a plurality of word lines (e.g., word line layers WLL0-WLL10 of FIG. 5A) and arranged in strings (e.g., NAND string 700n of FIG. 5A). The memory cells are configured to retain a threshold voltage Vt or $V_{TH}$ corresponding to one of a plurality of data states (e.g., distributions 800-806 of FIG. 7) and be erased in an erase operation. As shown in FIG. 19, during the erase operation, the method includes the steps of 1300 receiving an erase command and 1302 applying a first erase pulse of an erase voltage VERA to the strings while simultaneously applying a word line erase voltage to the plurality of word lines in response to receiving an erase command. The method also includes the step of 1304 identifying ones of the strings having a faster relative erase speed compared to others of the strings.

According to an aspect, to identify the ones of the strings having the faster relative erase speed, the method also includes the step of 1306 applying at least erase pulse of an erase voltage VERA to the strings while simultaneously applying a word line erase voltage to the plurality of word lines. The next step of the method is 1308 applying at least one read voltage to the plurality of word lines and counting quantities of the memory cells of the strings having the threshold voltage Vt above the at least one read voltage. The method continues with the step of 1310 identifying the ones of the strings having the faster relative erase speed compared to others of the strings based on the quantities of the memory cells of the strings having the threshold voltage Vt above the at least one read voltage.

So, continuing to refer to FIG. 19, the method includes the step of 1312 selecting the ones of the strings having the faster relative erase speed and unselecting the others of the strings. The method also includes the step of 1314 during the erase operation, raising the threshold voltage Vt of the memory cells associated with the ones of the strings having the faster relative erase speed by applying a predetermined programming voltage VPGM thereto while not raising the threshold voltage Vt of the memory cells associated with the others of the strings. In more detail, the method includes the step of 1316 applying the predetermined programming voltage VPGM to the memory cells associated with the ones of the strings having the faster relative erase speed while not applying the predetermined programming voltage VPGM to the memory cells associated with the others of the strings.

The method continues with the step of 1318 applying one of a plurality of subsequent erase pulses of the erase voltage VERA to the strings while simultaneously applying the word line erase voltage to the plurality of word lines. The method also includes the step of 1320 applying an erase verify voltage to each the plurality of word lines and sensing to determine whether the threshold voltage Vt of the memory cells is below an erase-verify level representing an erased state of the plurality of data states during a verify portion of the erase operation. The method additionally includes the step of 1322 determining whether a quantity of the strings associated with memory cells having the threshold voltage Vt below the erase-verify level is greater than a predetermined quantity of the strings to pass the verify portion of the erase operation. In addition, the method includes the step of 1324 increasing the erase voltage VERA by a delta erase voltage ΔVERA and returning to applying one of the plurality of subsequent erase pulses of the erase voltage VERA to the strings while simultaneously applying the word line erase voltage to the plurality of word lines in response to the quantity of the strings associated with memory cells having the threshold voltage Vt below the erase-verify level not being greater than the predetermined quantity of the strings to pass the verify portion of the erase operation. The method proceeds by 1326 concluding the erase operation in response to the quantity of the strings associated with memory cells having the threshold voltage Vt below the erase-verify level being greater than the predetermined quantity of the strings to pass the verify portion of the erase operation.

Again, the plurality of word lines extend horizontally through the block and are spaced apart from one another vertically and the strings extend vertically through the block orthogonally to the plurality of word lines. The block defines opposing edges extending vertically along the block. The strings include a plurality of outer strings being disposed horizontally closer to the opposing edges and a plurality of inner strings being horizontally further from the opposing edges than the plurality of outer strings. Each of the strings comprises a memory hole extending vertically through the block and filled with materials including blocking oxide layers to form the memory cells adjacent to each the plurality of word lines and the faster relative erase speed of the ones of the strings compared to others of the strings depends on a horizontal proximity of the strings to the opposing edges of the block due to variation of a thickness of the blocking oxide layers.

Thus, referring to FIG. 20, the method includes the steps of 1300 receiving an erase command and 1302 applying a first erase pulse of an erase voltage VERA to the strings while simultaneously applying a word line erase voltage to the plurality of word lines in response to receiving an erase command. FIG. 21A shows a threshold voltage Vt distribution for the plurality of inner strings and for the plurality of outer strings that together form a total erase threshold voltage Vt distribution after the first erase pulse.

Referring back to FIG. 20, the method further includes the step of 1328 selecting the plurality of inner strings and unselecting the plurality of outer strings while applying the predetermined programming voltage VPGM to the plurality of word lines during the erase operation. As in the example shown in FIG. 16, there are two outer strings and three inner strings, such application of the predetermined programming voltage VPGM to the plurality of inner strings is known as "triple string programming". Such strings may comprise multiple NAND strings and as discussed above, may be carried out concurrently. Each of the strings includes the memory cells connected in series between at least one drain end select gate transistor on a drain end of the each of the strings connected to a bit line and at least one source end select gate transistor on a source end of the each of the strings connected to a source line. Thus, the method further includes the step of 1330 selecting the plurality of inner strings by applying a select voltage VSGD to the at least one drain end select gate transistor associated with each of the plurality of inner strings, The method also includes the step of 1332 unselecting the plurality of outer strings by applying an unselect voltage to the at least one drain end select gate transistor associated with each of the plurality of outer strings.

As shown in FIG. 20, the method continues by 1334 applying the predetermined programming voltage VPGM to the memory cells associated with the plurality of inner strings while not applying the predetermined programming voltage VPGM to the memory cells associated with the plurality of outer strings. FIG. 21B shows another threshold voltage Vt distribution for the plurality of inner strings and for the plurality of outer strings that together form a total erase threshold voltage Vt distribution after the triple string programming.

Referring back to FIG. 20, the method includes the step of 1318 applying one of a plurality of subsequent erase pulses of the erase voltage VERA to the strings while simultaneously applying the word line erase voltage to the plurality of word lines. The method also includes the step of 1320 applying an erase verify voltage to each the plurality of word lines and sensing to determine whether the threshold voltage Vt of the memory cells is below an erase-verify level representing an erased data state of the plurality of data states during a verify portion of the erase operation. The next step of the method is 1322 determining whether a quantity of the strings associated with memory cells having the threshold voltage Vt below the erase-verify level is greater than a predetermined quantity of the strings to pass the verify portion of the erase operation. The method continues by 1324 increasing the erase voltage VERA by a delta erase voltage ΔVERA and returning to applying one of the plurality of subsequent erase pulses of the erase voltage VERA to the strings while simultaneously applying the word line erase voltage to the plurality of word lines in response to the quantity of the strings associated with memory cells having the threshold voltage Vt below the erase-verify level not being greater than the predetermined quantity of the strings to pass the verify portion of the erase operation. In addition, the method includes the step of 1326 concluding the erase operation in response to the quantity of the strings associated with memory cells having the threshold voltage Vt below the erase-verify level being greater than the predetermined quantity of the strings to pass the verify portion of the erase operation. FIG. 21C shows another threshold voltage Vt distribution for the plurality of inner strings and for the plurality of outer strings that together form a final erase threshold voltage Vt distribution at the end of the erase operation.

Thus, the memory apparatus and method of operating the memory apparatus disclosed herein provide numerous advantages. These advantages include improved endurance for the plurality of inner strings (thus improve the full block endurance). In addition, better data retention for the memory cells of the plurality of inner string (less lateral charge diffusion during HTDR) is also provided. Furthermore, there is less of a defect (dppm) issue for the plurality of inner strings due to shallower erase depth.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   a block of memory cells, each of the memory cells connected to one of a plurality of word lines and arranged in strings and configured to retain a threshold voltage corresponding to one of a plurality of data states and be erased in an erase operation; and
   a control circuit coupled to the word lines and the strings and configured to:
      identify ones of the strings having a faster relative erase speed compared to others of the strings, and
      during the erase operation, raise the threshold voltage of the memory cells associated with the ones of the strings having the faster relative erase speed while not raising the threshold voltage of the memory cells associated with the others of the strings.

2. The memory apparatus as set forth in claim 1, wherein the plurality of word lines extend horizontally through the block and are spaced apart from one another vertically and the strings extend vertically through the block orthogonally to the plurality of word lines, the block defining opposing edges extending vertically along the block, the strings include a plurality of outer strings being disposed horizontally closer to the opposing edges and a plurality of inner strings being horizontally further from the opposing edges than the plurality of outer strings, and the control circuit is further configured to select the plurality of inner strings and unselect the plurality of outer strings while applying a predetermined programming voltage to the plurality of word lines during the erase operation.

3. The memory apparatus as set forth in claim 2, wherein each of the strings includes the memory cells connected in series between at least one drain end select gate transistor on a drain end of the each of the strings connected to a bit line and at least one source end select gate transistor on a source end of the each of the strings connected to a source line and the control circuit is further configured to:
   select the plurality of inner strings by applying a select voltage to the at least one drain end select gate transistor associated with each of the plurality of inner strings; and
   unselect the plurality of outer strings by applying an unselect voltage to the at least one drain end select gate transistor associated with each of the plurality of outer strings.

4. The memory apparatus as set forth in claim 2, wherein during the erase operation, the control circuit is further configured to:
   apply a first erase pulse of an erase voltage to the strings while simultaneously applying a word line erase voltage to the plurality of word lines in response to receiving an erase command;
   apply the predetermined programming voltage to the memory cells associated with the plurality of inner strings while not applying the predetermined programming voltage to the memory cells associated with the plurality of outer strings;
   apply one of a plurality of subsequent erase pulses of the erase voltage to the strings while simultaneously applying the word line erase voltage to the plurality of word lines;

apply an erase verify voltage to each of the plurality of word lines and sense to determine whether the threshold voltage of the memory cells is below an erase-verify level representing an erased data state of the plurality of data states during a verify portion of the erase operation;

determine whether a quantity of the strings associated with memory cells having the threshold voltage below the erase-verify level is greater than a predetermined quantity of the strings to pass the verify portion of the erase operation;

increase the erase voltage by a delta erase voltage and return to apply one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and conclude the erase operation in response to the quantity of the strings associated with memory cells having the threshold voltage below the erase-verify level being greater than the predetermined quantity of the strings to pass the verify portion of the erase operation.

5. The memory apparatus as set forth in claim 2, wherein each of the strings comprises a memory hole extending vertically through the block and filled with materials including blocking oxide layers to form the memory cells adjacent to each the plurality of word lines and the faster relative erase speed of the ones of the strings compared to others of the strings depends on a horizontal proximity of the strings to the opposing edges of the block due to variation of a thickness of the blocking oxide layers.

6. The memory apparatus as set forth in claim 1, wherein during the erase operation, the control circuit is further configured to:

apply a first erase pulse of an erase voltage to the strings while simultaneously applying a word line erase voltage to the plurality of word lines in response to receiving an erase command;

select the ones of the strings having the faster relative erase speed and unselect the others of the strings;

apply a predetermined programming voltage to the memory cells associated with the ones of the strings having the faster relative erase speed while not applying the predetermined programming voltage to the memory cells associated with the others of the strings;

apply one of a plurality of subsequent erase pulses of the erase voltage to the strings while simultaneously applying the word line erase voltage to the plurality of word lines;

apply an erase verify voltage to each of the plurality of word lines and sense to determine whether the threshold voltage of the memory cells is below an erase-verify level representing an erased state of the plurality of data states during a verify portion of the erase operation;

determine whether a quantity of the strings associated with memory cells having the threshold voltage below the erase-verify level is greater than a predetermined quantity of the strings to pass the verify portion of the erase operation;

increase the erase voltage by a delta erase voltage and return to apply one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and conclude the erase operation in response to the quantity of the strings associated with memory cells having the threshold voltage below the erase-verify level being greater than the predetermined quantity of the strings to pass the verify portion of the erase operation.

7. The memory apparatus as set forth in claim 1, wherein the control circuit is further configured to:

apply at least erase pulse of an erase voltage to the strings while simultaneously applying a word line erase voltage to the plurality of word lines;

apply at least one read voltage to the plurality of word lines and count quantities of the memory cells of the strings having the threshold voltage above the at least one read voltage; and identify the ones of the strings having the faster relative erase speed compared to others of the strings based on the quantities of the memory cells of the strings having the threshold voltage above the at least one read voltage.

8. A controller in communication with a memory apparatus including a block of memory cells, each of the memory cells connected to one of a plurality of word lines and arranged in strings and configured to retain a threshold voltage corresponding to one of a plurality of data states and be erased in an erase operation, the controller configured to:

instruct the memory apparatus to identify ones of the strings having a faster relative erase speed compared to others of the strings; and during the erase operation, instruct the memory apparatus to raise the threshold voltage of the memory cells associated with the ones of the strings having the faster relative erase speed while not raising the threshold voltage of the memory cells associated with the others of the strings.

9. The controller as set forth in claim 8, wherein the plurality of word lines extend horizontally through the block and are spaced apart from one another vertically and the strings extend vertically through the block orthogonally to the plurality of word lines, the block defining opposing edges extending vertically along the block, the strings include a plurality of outer strings being disposed horizontally closer to the opposing edges and a plurality of inner strings being horizontally further from the opposing edges than the plurality of outer strings, and the controller is further configured to instruct the memory apparatus to select the plurality of inner strings and unselect the plurality of outer strings while applying a predetermined programming voltage to the plurality of word lines during the erase operation.

10. The controller as set forth in claim 9, wherein during the erase operation, the controller is further configured to:

instruct the memory apparatus to apply a first erase pulse of an erase voltage to the strings while simultaneously applying a word line erase voltage to the plurality of word lines in response to receiving an erase command;

instruct the memory apparatus to apply the predetermined programming voltage to the memory cells associated with the plurality of inner strings while not applying the predetermined programming voltage to the memory cells associated with the plurality of outer strings;

instruct the memory apparatus to apply one of a plurality of subsequent erase pulses of the erase voltage to the strings while simultaneously applying the word line erase voltage to the plurality of word lines;

instruct the memory apparatus to apply an erase verify voltage to each of the plurality of word lines and sense to determine whether the threshold voltage of the memory cells is below an erase-verify level representing an erased data state of the plurality of data states during a verify portion of the erase operation;

determine whether a quantity of the strings associated with memory cells having the threshold voltage below the erase-verify level is greater than a predetermined quantity of the strings to pass the verify portion of the erase operation;

instruct the memory apparatus to increase the erase voltage by a delta erase voltage and return to apply one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and conclude the erase operation in response to the quantity of the strings associated with memory cells having the threshold voltage below the erase-verify level being greater than the predetermined quantity of the strings to pass the verify portion of the erase operation.

11. The controller as set forth in claim 9, wherein each of the strings comprises a memory hole extending vertically through the block and filled with materials including blocking oxide layers to form the memory cells adjacent to each the plurality of word lines and the faster relative erase speed of the ones of the strings compared to others of the strings depends on a horizontal proximity of the strings to the opposing edges of the block due to variation of a thickness of the blocking oxide layers.

12. The controller as set forth in claim 8, wherein during the erase operation, the controller is further configured to:

instruct the memory apparatus to apply a first erase pulse of an erase voltage to the strings while simultaneously applying a word line erase voltage to the plurality of word lines in response to receiving an erase command;

instruct the memory apparatus to select the ones of the strings having the faster relative erase speed and unselect the others of the strings;

instruct the memory apparatus to apply a predetermined programming voltage to the memory cells associated with the ones of the strings having the faster relative erase speed while not applying the predetermined programming voltage to the memory cells associated with the others of the strings;

instruct the memory apparatus to apply one of a plurality of subsequent erase pulses of the erase voltage to the strings while simultaneously applying the word line erase voltage to the plurality of word lines;

instruct the memory apparatus to apply an erase verify voltage to each of the plurality of word lines and sense to determine whether the threshold voltage of the memory cells is below an erase-verify level representing an erased state of the plurality of data states during a verify portion of the erase operation;

determine whether a quantity of the strings associated with memory cells having the threshold voltage below the erase-verify level is greater than a predetermined quantity of the strings to pass the verify portion of the erase operation;

instruct the memory apparatus to increase the erase voltage by a delta erase voltage and return to apply one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and conclude the erase operation in response to the quantity of the strings associated with memory cells having the threshold voltage below the erase-verify level being greater than the predetermined quantity of the strings to pass the verify portion of the erase operation.

13. The controller as set forth in claim 8, wherein the controller is further configured to:

instruct the memory apparatus to apply at least erase pulse of an erase voltage to the strings while simultaneously applying a word line erase voltage to the plurality of word lines;

instruct the memory apparatus to apply at least one read voltage to the plurality of word lines and count quantities of the memory cells of the strings having the threshold voltage above the at least one read voltage; and instruct the memory apparatus to identify the ones of the strings having the faster relative erase speed compared to others of the strings based on the quantities of the memory cells of the strings having the threshold voltage above the at least one read voltage.

14. A method of operating a memory apparatus including a block of memory cells, each of the memory cells connected to one of a plurality of word lines and arranged in strings and configured to retain a threshold voltage corresponding to one of a plurality of data states and be erased in an erase operation, the method comprising the steps of:

identifying ones of the strings having a faster relative erase speed compared to others of the strings; and during the erase operation, raising the threshold voltage of the memory cells associated with the ones of the strings having the faster relative erase speed while not raising the threshold voltage of the memory cells associated with the others of the strings.

15. The method as set forth in claim 14, wherein the plurality of word lines extend horizontally through the block and are spaced apart from one another vertically and the strings extend vertically through the block orthogonally to the plurality of word lines, the block defining opposing edges extending vertically along the block, the strings include a plurality of outer strings being disposed horizontally closer to the opposing edges and a plurality of inner strings being horizontally further from the opposing edges than the plurality of outer strings, and the method further includes the step of selecting the plurality of inner strings and unselecting the plurality of outer strings while applying a predetermined programming voltage to the plurality of word lines during the erase operation.

16. The method as set forth in claim 15, wherein each of the strings includes the memory cells connected in series between at least one drain end select gate transistor on a drain end of the each of the strings connected to a bit line and at least one source end select gate transistor on a source end of the each of the strings connected to a source line and the method further includes the steps of:

selecting the plurality of inner strings by applying a select voltage to the at least one drain end select gate transistor associated with each of the plurality of inner strings; and unselecting the plurality of outer strings by applying an unselect voltage to the at least one drain end select gate transistor associated with each of the plurality of outer strings.

17. The method as set forth in claim 15, wherein during the erase operation, the method further includes the steps of:

applying a first erase pulse of an erase voltage to the strings while simultaneously applying a word line erase voltage to the plurality of word lines in response to receiving an erase command;

applying the predetermined programming voltage to the memory cells associated with the plurality of inner strings while not applying the predetermined programming voltage to the memory cells associated with the plurality of outer strings;

applying one of a plurality of subsequent erase pulses of the erase voltage to the strings while simultaneously applying the word line erase voltage to the plurality of word lines;

applying an erase verify voltage to each of the plurality of word lines and sensing to determine whether the threshold voltage of the memory cells is below an erase-verify level representing an erased data state of the plurality of data states during a verify portion of the erase operation;

determining whether a quantity of the strings associated with memory cells having the threshold voltage below the erase-verify level is greater than a predetermined quantity of the strings to pass the verify portion of the erase operation;

increasing the erase voltage by a delta erase voltage and returning to applying one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and concluding the erase operation in response to the quantity of the strings associated with memory cells having the threshold voltage below the erase-verify level being greater than the predetermined quantity of the strings to pass the verify portion of the erase operation.

18. The method as set forth in claim 15, wherein each of the strings comprises a memory hole extending vertically through the block and filled with materials including blocking oxide layers to form the memory cells adjacent to each the plurality of word lines and the faster relative erase speed of the ones of the strings compared to others of the strings depends on a horizontal proximity of the strings to the opposing edges of the block due to variation of a thickness of the blocking oxide layers.

19. The method as set forth in claim 14, wherein during the erase operation, the method further includes the steps of:

applying a first erase pulse of an erase voltage to the strings while simultaneously applying a word line erase voltage to the plurality of word lines in response to receiving an erase command;

selecting the ones of the strings having the faster relative erase speed and unselecting the others of the strings;

applying a predetermined programming voltage to the memory cells associated with the ones of the strings having the faster relative erase speed while not applying the predetermined programming voltage to the memory cells associated with the others of the strings;

applying one of a plurality of subsequent erase pulses of the erase voltage to the strings while simultaneously applying the word line erase voltage to the plurality of word lines;

applying an erase verify voltage to each of the plurality of word lines and sensing to determine whether the threshold voltage of the memory cells is below an erase-verify level representing an erased state of the plurality of data states during a verify portion of the erase operation;

determining whether a quantity of the strings associated with memory cells having the threshold voltage below the erase-verify level is greater than a predetermined quantity of the strings to pass the verify portion of the erase operation;

increasing the erase voltage by a delta erase voltage and returning to applying one of the plurality of subsequent erase pulses of the erase voltage to the strings while simultaneously applying the word line erase voltage to the plurality of word lines in response to the quantity of the strings associated with memory cells having the threshold voltage below the erase-verify level not being greater than the predetermined quantity of the strings to pass the verify portion of the erase operation; and concluding the erase operation in response to the quantity of the strings associated with memory cells having the threshold voltage below the erase-verify level being greater than the predetermined quantity of the strings to pass the verify portion of the erase operation.

20. The method as set forth in claim 14, wherein the method further includes the steps of:

applying at least erase pulse of an erase voltage to the strings while simultaneously applying a word line erase voltage to the plurality of word lines;

applying at least one read voltage to the plurality of word lines and counting quantities of the memory cells of the strings having the threshold voltage above the at least one read voltage; and identifying the ones of the strings having the faster relative erase speed compared to others of the strings based on the quantities of the memory cells of the strings having the threshold voltage above the at least one read voltage.

* * * * *